(12) United States Patent
Jung et al.

(10) Patent No.: US 9,606,452 B2
(45) Date of Patent: Mar. 28, 2017

(54) LITHOGRAPHY METROLOGY METHOD FOR DETERMINING BEST FOCUS AND BEST DOSE AND LITHOGRAPHY MONITORING METHOD USING THE SAME

(71) Applicant: SAMSUNG ELECTRONICS CO., LTD., Suwon-si, Gyeonggi-do (KR)

(72) Inventors: Byung-Je Jung, Suwon-si (KR); Yong-Jin Chun, Daejeon (KR); Byoung-Il Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 175 days.

(21) Appl. No.: 14/705,736

(22) Filed: May 6, 2015

(65) Prior Publication Data
US 2016/0085155 A1 Mar. 24, 2016

(30) Foreign Application Priority Data
Sep. 19, 2014 (KR) ...................... 1 0-2014-0125299

(51) Int. Cl.
*G03F 7/20* (2006.01)
*G01B 11/24* (2006.01)

(52) U.S. Cl.
CPC .......... *G03F 7/70558* (2013.01); *G01B 11/24* (2013.01); *G03F 7/70625* (2013.01); *G03F 7/70641* (2013.01)

(58) Field of Classification Search
CPC ............. G03F 7/70558; G03F 7/70625; G03F 7/70641; G01B 11/24

USPC .................................................... 430/30, 394
See application file for complete search history.

(56) References Cited

U.S. PATENT DOCUMENTS 6,721,940 B2 4/2004 Miwa et al.
8,703,369 B2 4/2014 Spaziani et al.

FOREIGN PATENT DOCUMENTS

| JP | 3077657 | 6/2000 |
|---|---|---|
| JP | 2006-128572 | 5/2006 |
| JP | 2007-141949 | 6/2007 |
| JP | 2011-003644 | 1/2011 |
| JP | 2012-043942 | 3/2012 |
| KR | 10-0919802 | 9/2009 |

*Primary Examiner* — Christopher Young
(74) *Attorney, Agent, or Firm* — Volentine & Whitt, PLLC

(57) ABSTRACT

A lithography metrology method is provided. Focus sensitivity data and dose sensitivity data of sample patterns to be formed on a substrate are acquired. At least one focus pattern selected in descending order of focus sensitivity from among the acquired focus sensitivity data of the sample patterns is determined. At least one low-sensitivity focus pattern in ascending order of the focus sensitivity from among the acquired dose sensitivity data of the sample patterns is selected, and at least one dose pattern selected in descending order of dose sensitivity from among the at least one low-sensitivity focus pattern is determined. A split substrate having a plurality of chip regions is prepared. A plurality of focus split patterns having a shape corresponding to the at least one focus pattern and a plurality of dose split patterns having a shape corresponding to the at least one dose pattern in the plurality of chip regions are formed. A best focus and a best dose from the plurality of focus split patterns and the plurality of dose split patterns are determined.

20 Claims, 27 Drawing Sheets

LITHOGRAPHY METROLOGY METHOD FOR DETERMINING BEST FOCUS AND BEST DOSE AND LITHOGRAPHY MONITORING METHOD USING THE SAME

PRIORITY STATEMENT

This application claims the benefit of Korean Patent Application No. 10-2014-0125299, filed on Sep. 19, 2014, in the Korean Intellectual Property Office, the disclosure of which is hereby incorporated by reference in its entirety.

BACKGROUND

The inventive concept relates to a lithography metrology method and to a lithography monitoring method using the same. More particularly, the inventive concept relates to a lithography metrology method for determining the best focus and the best dose for a lithography process and to a lithography monitoring method using the same.

As semiconductor devices have become more highly integrated, various lithography technologies have been developed for forming finer patterns constituting the devices. Lithography technologies, in general, entail forming a photoresist on a substrate, patterning the photoresist by exposing and developing the photoresist, and then using the resulting photoresist pattern as a mask to etch a layer(s) below the photoresist pattern. Thus, a critical dimension (CD) of photoresist patterns has become smaller. If a photoresist pattern having the desired or 'target" CD is to be formed then the exposure process must be carried according to strictly controlled parameters including depth of focus and dose.

In addition, various measuring technologies have been proposed and developed for monitoring a lithography process, e.g., for measuring critical dimensions of patterns formed during the manufacturing of ultra-highly integrated devices.

SUMMARY

According to an aspect of the inventive concept, there is provided a lithography metrology method including: acquiring focus sensitivity data and dose sensitivity data of sample patterns to be formed on a substrate; determining at least one focus pattern selected in descending order of focus sensitivity from among the acquired focus sensitivity data of the sample patterns; selecting at least one low-sensitivity focus pattern in ascending order of the focus sensitivity from among the acquired dose sensitivity data of the sample patterns, and determining at least one dose pattern selected in descending order of dose sensitivity from among the at least one low-sensitivity focus pattern; preparing a split substrate having a plurality of chip regions; forming a plurality of focus split patterns having a shape corresponding to the at least one focus pattern and a plurality of dose split patterns having a shape corresponding to the at least one dose pattern in the plurality of chip regions; and determining a best focus and a best dose from the plurality of focus split patterns and the plurality of dose split patterns.

According to another aspect of the inventive concept, there is provided a lithography metrology method including: acquiring focus sensitivity data and dose sensitivity data with respect to sample patterns to be formed on a substrate; determining at least one focus pattern selected in descending order of focus sensitivity from among the acquired focus sensitivity data of the sample patterns; selecting at least one low-sensitivity focus pattern in ascending order of the focus sensitivity from among the acquired dose sensitivity data of the sample patterns, and determining at least one dose pattern selected in descending order of dose sensitivity from among the at least one low-sensitivity focus pattern; preparing a split substrate having a plurality of chip regions; dividing the plurality of chip regions into a plurality of focus split regions and a plurality of dose split regions, and performing an exposure process and a development process on the plurality of chip regions such that different focuses are applied to the plurality of focus split regions and different doses are applied to the plurality of dose split regions, thereby forming a plurality of split chip regions, each of which includes the focus split pattern having a shape corresponding to the at least one focus pattern and the dose split pattern having a shape corresponding to the at least one dose pattern, on the split substrate; measuring first CDs of the dose split patterns included in a split chip region corresponding to a focus split region, to which a same focus is applied, among the plurality of split chip regions, and determining a best dose from the measured values of the first CDs; and measuring second CDs of the focus split patterns included in a dose split region, to which a same dose as the determined best dose is applied, among the plurality of split chip regions, and determining a best focus from the measured values of the second CDs.

According to another aspect of the inventive concept, there is provided a lithography metrology method including acquiring focus sensitivity data and dose sensitivity data of sample patterns to be formed on a substrate, using the acquired focus sensitivity data to select at least one of the sample patterns as a focus pattern or patterns, using the acquired focus sensitivity and dose sensitivity data to select at least one of the sample patterns as a dose pattern or patterns, preparing a split substrate having a plurality of chip regions, forming a plurality of focus split patterns and forming a plurality of dose split patterns in the plurality of chip regions, and determining a depth of focus and dose of a lithography method from the plurality of focus split patterns and the plurality of dose split patterns. The at least one of the sample patterns selected as the focus pattern or patterns has a critical dimension (CD) that is among the most dependent among the CDs of the sample patterns on depth of focus of an exposure process. The at least one of the sample patterns selected as the dose pattern or patterns has a CD that is among the most dependent among the CDs of the sample patterns on the dose of the exposure and is among the least dependent among the CDs of the sample patterns on the depth the focus of the exposure process. Also, each of the focus split patterns has a shape corresponding to that of the at least one focus pattern and each of the does spit patterns has a shape corresponding to that of the at least one dose pattern.

According to another aspect of the inventive concept, there is provided a lithography monitoring method including: forming pattern elements necessary for an integrated circuit device on a substrate; measuring actual values of CDs of the pattern elements; acquiring a first comparison result based on dose sensitivity by comparing measured values of first CDs obtained from at least one dose pattern selected in descending order of the dose sensitivity with actual values of the CDs of the pattern elements according to the lithography metrology method of the inventive concept; acquiring a second comparison result based on focus sensitivity by comparing measured values of second CDs obtained from at least one focus pattern selected in descending order of the focus sensitivity with actual values of the CDs of the pattern elements according to the lithography metrology method of the inventive concept; and determining whether the focus and the dose of the pattern elements are best, based on the first and second comparison results.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE PREFERRED EMBODIMENTS

Figure 1:
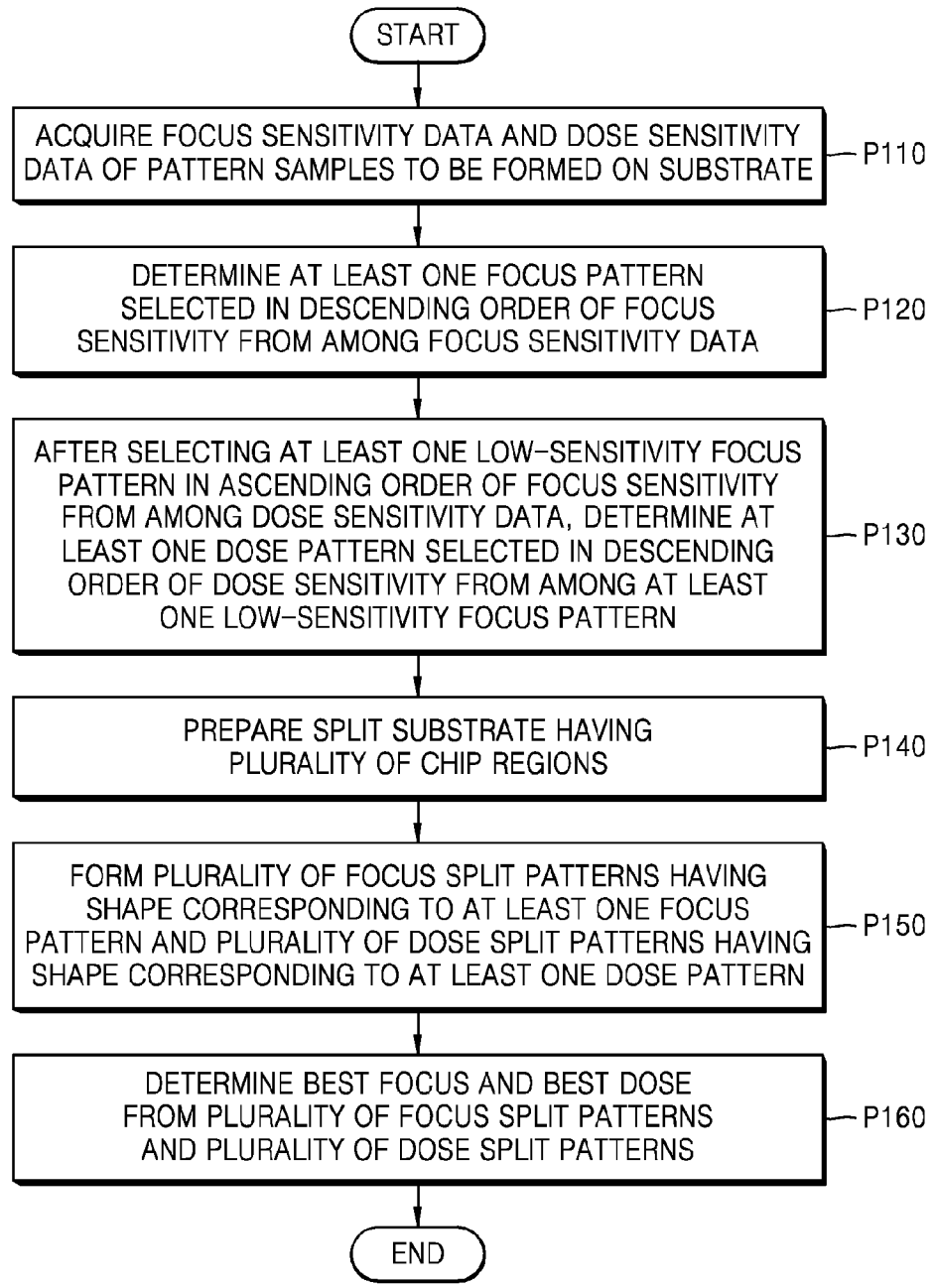
FIG. 1 is a flowchart of a lithography metrology method according to an exemplary embodiment of the inventive concept.

Hereinafter, embodiments of the inventive concept will be described with reference to the accompanying drawings. Like reference numerals denote like elements throughout the specification and drawings, and a redundant description thereof will be omitted.

The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. As used herein, the term "and/or" includes any and all combinations of one or more of the associated listed items.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

Unless otherwise defined, all terms (including technical and scientific terms) used herein have the same meaning as commonly understood by one of ordinary skill in the art to which the inventive concept belongs. For example, those of ordinary skill in the art will readily understand that the terms "focus" and "defocus" pertain to the process parameter of depth of focus known in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Expressions such as "at least one of," when preceding a list of elements, modify the entire list of elements and do not modify the individual elements of the list.

When a certain embodiment may be implemented differently, a specific process order may be performed differently from the described order. For example, two consecutively described processes may be performed substantially at the same time or performed in an order opposite to the described order.

In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes.

FIG. 1 is a flowchart of a lithography metrology method according to an exemplary embodiment of the inventive concept.

Referring to FIG. 1, in operation P110, focus sensitivity data and dose sensitivity data are acquired with respect to sample patterns to be formed on a substrate.

Figure 2:
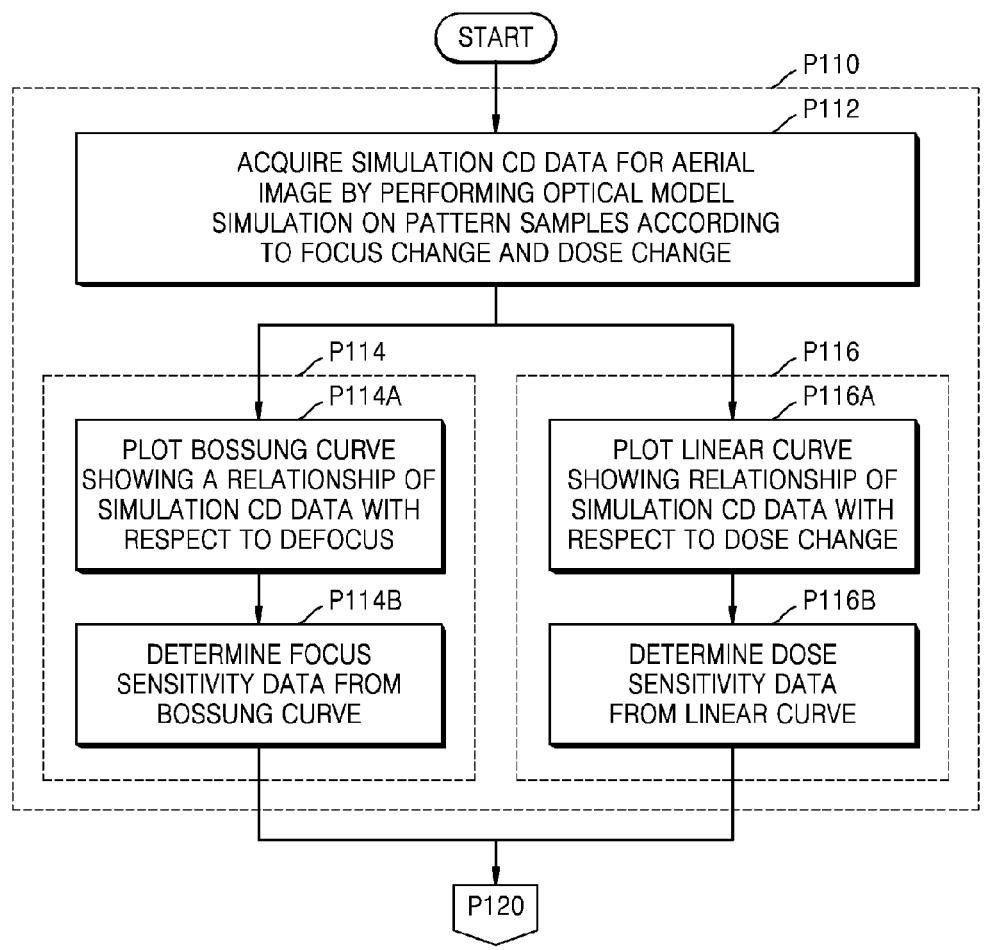
FIG. 2 is a flowchart of a process of acquiring focus sensitivity data and a process of acquiring dose sensitivity data in lithography metrology methods according to exemplary embodiments of the inventive concept.

FIG. 2 is a flowchart of an example of the process (operation P110) of acquiring focus sensitivity data and a process of acquiring dose sensitivity data in the method of FIG. 1.

Referring to FIG. 2, in operation P112, critical dimension (CD) data of an aerial image of sample patterns is acquired from an optical model simulation in which depth of focus and dose are each varied in forming the sample patterns.

In operation P114, the focus sensitivity data of the sample patterns are acquired based on the CD data acquired through simulation.

More specifically, in operation P114A, a Bossung curve illustrating a relationship of the CD data with respect to defocus is plotted from the CD data acquired through simulation in operation P112. In operation P114B, the focus sensitivity data is determined from the Bossung curve.

Figure 3:
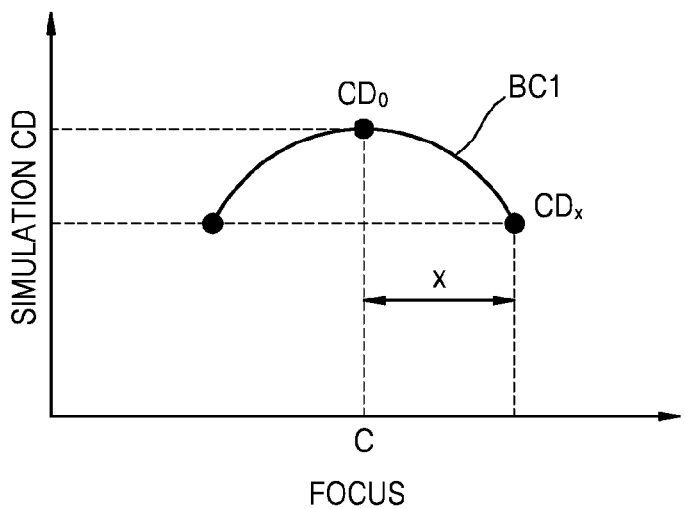
FIG. 3 is a graph of a Bossung curve plotted in lithography metrology methods according to exemplary embodiments of the inventive concept.

FIG. 3 is an example of a Bossung curve BC1 plotted according to operation P114B.

Referring to FIG. 3, the Bossung curve BC1 illustrates the relationship between CDs corresponding to line widths of the sample patterns and beam focuses (depth of focus) in an exposure process of the optical model simulation. $CD_0$ is a value of the CD data at a center value C of a beam focus, for example, a value of the CD data when defocus is 0 in the Bossung curve BC1. $CD_x$ is an allowable lower limit value of the CD data, for example, a value of the CD data when the beam is defocused by x from 0 as illustrated in the Bossung curve BC1. In some exemplary embodiments, $CD_x$ may be set to have a value of about $CD_0 \pm 10\%$. The term "defocus" refers to a deviation from the optimal focus (depth of focus) along an optical axis, that is, an axis perpendicular to the focal plane of the beam. That is, defocus is a variation from the focus that produces the best pattern on the substrate from a photoresist on the substrate, the best pattern being that which has a CD corresponding to that of the target CD. The depth of focus during the photolithography process may range between the best focus, corresponding to the center value C, and a defocus at a distance±x from the center value C.

The focus sensitivity may be calculated using Equation 1 below so as to determine the focus sensitivity data from the bossung curve BC1, in operation P114B.

$$\text{Focus sensitivity } (\%) = \{|CD_0 - CD_x|/CD_0\} \times 100 \qquad \text{[Equation 1]}$$

In Equation 1 above, $CD_0$ is a value of the simulation CD data when the defocus is 0 in the bossung curve BC1. $CD_x$ is a value of the simulation CD data when the defocus is x, i.e., when the depth of focus differs by x from 0 in the bossung curve BC1. The value of x is a constant greater than 0. The value of x may be determined in consideration of the actual lithography condition.

In operation P116 of FIG. 2, the dose sensitivity data of the sample patterns are acquired based on the CD data acquired through the optical model simulation.

More specifically, in operation P116A, a linear curve of a relationship between the CD data and dose is plotted from the CD data acquired in operation P112. In operation P116B, the dose sensitivity data is determined from the linear curve.

Figure 4:
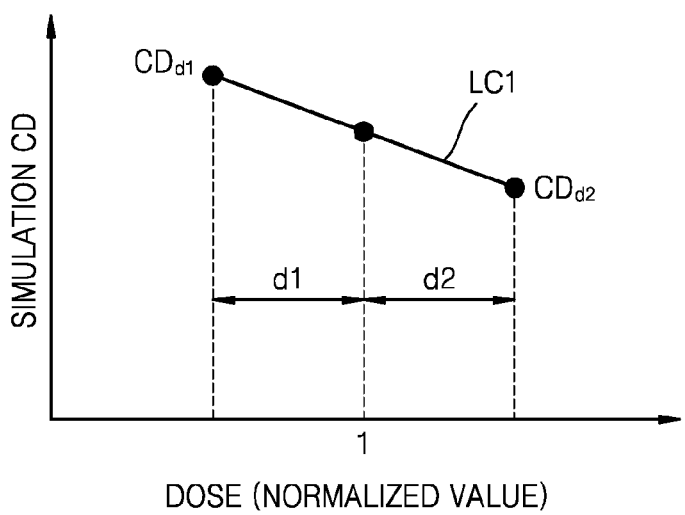
FIG. 4 is a graph of a linear curve plotted in lithography metrology methods according to exemplary embodiments of the inventive concept.

FIG. 4 illustrates an example of a linear curve LC1 plotted according to operation P116B.

The linear curve LC1 of FIG. 4 has a negative slope. The dose sensitivity may be calculated using Equation 2 below so as to determine the dose sensitivity data from the linear curve LC1, in operation P116B.

$$\text{Dose sensitivity } (\%) = \{|CD_{d1} - CD_{d2}|/CD_0\} \times 100 \qquad \text{[Equation 2]}$$

In Equation 2 above, $CD_{d1}$ is a CD data value when the dose is smaller by d1 than 1, that is, a reference dose at which the dose is normalized in the linear curve LC1. $CD_{d2}$ is a CD data value when the dose is larger by d2 than 1, that is, a reference dose at which the dose is normalized in the linear curve LC1. The values of d1 and d2 are constants greater than 0. $CD_0$ is a value of the simulation CD data when the defocus is 0 in the bossung curve BC1. The values of d1 and d2 may be determined in consideration of the actual exposure condition in a lithography process.

In operation P120 of FIG. 1, from among the sample patterns acquired in operation P110 at least one sample pattern, showing relatively high or the highest focus sensitivity, is/are selected as a focus pattern(s). In other words, the at least one focus pattern selected is a (sample) pattern(s) having a CD that is relatively highly dependent on changes in the depth of focus of the exposure process used to form that pattern(s).

The number of the focus patterns selected may be determined according to an actual exposure condition in a lithography process.

In operation P130 of FIG. 1 low-sensitivity focus sample patterns are selected from among the sample patterns, and a sample pattern(s) showing a relatively high or the highest dose sensitivity is/are selected from among these low-sensitivity focus sample patterns as a dose pattern(s). In other words, the at least one dose pattern selected in operation P130 is a (sample) pattern(s) whose CD is relatively highly dependent on the dose of the exposure process used to form the pattern, and is selected from among (sample) patterns whose CDs are not very dependent on the depth the focus of the exposure process.

In some exemplary embodiments, the at least one low-sensitivity focus pattern may be selected from among patterns of which the focus sensitivity calculated using Equation 1 above is equal to or lower than about 1%.

The number of the dose patterns may be determined according to the actual exposure condition in a lithography process.

Because the at least one focus pattern determined in operation P120 has a relatively high focus sensitivity and the at least one dose pattern determined in operation P130 has a relatively high dose sensitivity, the values of the CDs of the at least one focus pattern and the at least one dose pattern may change greatly with changes in the depth of focus and changes in the dose of an exposure process, respectively. Therefore, these patterns may be effectively used to accurately find the best focus and the best dose of an exposure process in a lithography method of forming a photoresist pattern on a substrate.

In operation P140 of FIG. 1, a split substrate having a plurality of chip regions is prepared.

Figure 5A:
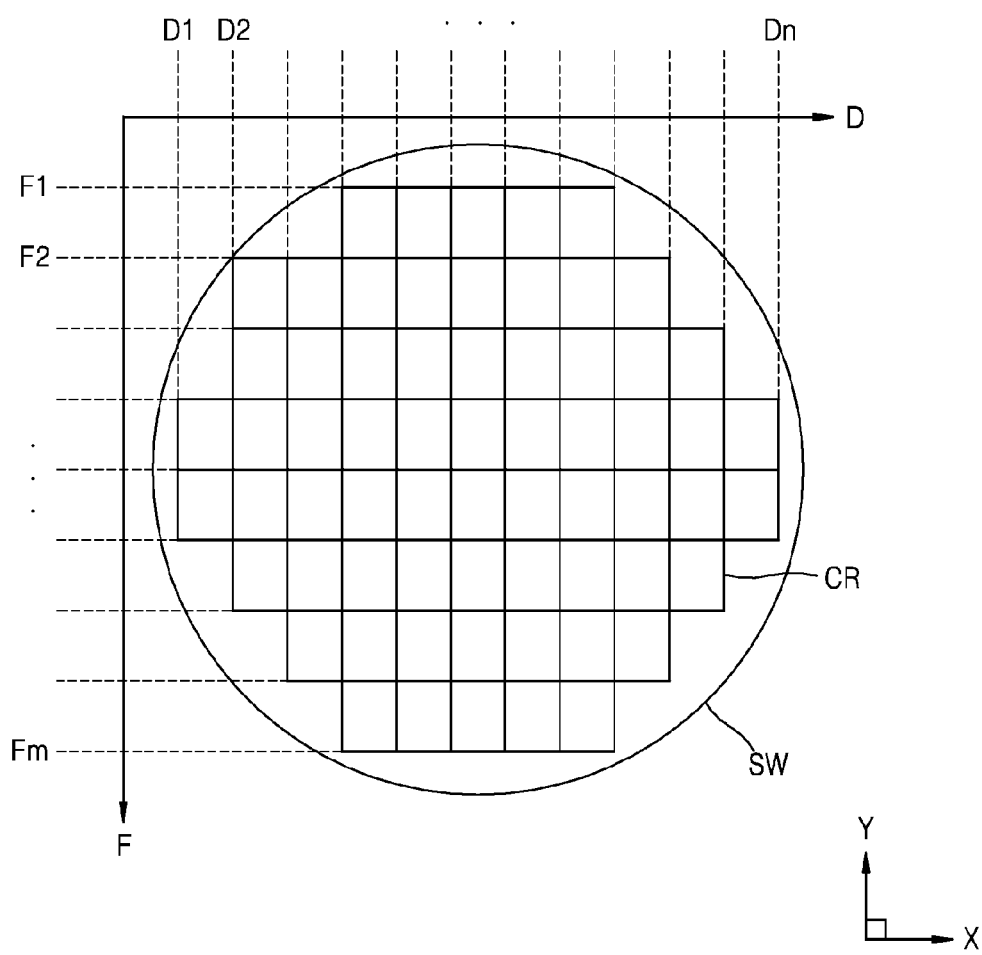
FIG. 5A is a diagram illustrating a split substrate having a plurality of chip regions, which is prepared in lithography metrology methods according to exemplary embodiments of the inventive concept.

FIG. 5A illustrates a split substrate SW having a plurality of chip regions CR, which is prepared in operation P140.

In operation P150 of FIG. 1, the plurality of focus split patterns, which have a shape corresponding to the at least one focus pattern determined in operation P120, and the plurality of dose split patterns, which have a shape corresponding to the at least one dose pattern determined in operation P130, are formed in the plurality of chip regions CR on the split substrate prepared in operation P140, for example, the split substrate SW of FIG. 5A.

Figure 5B:
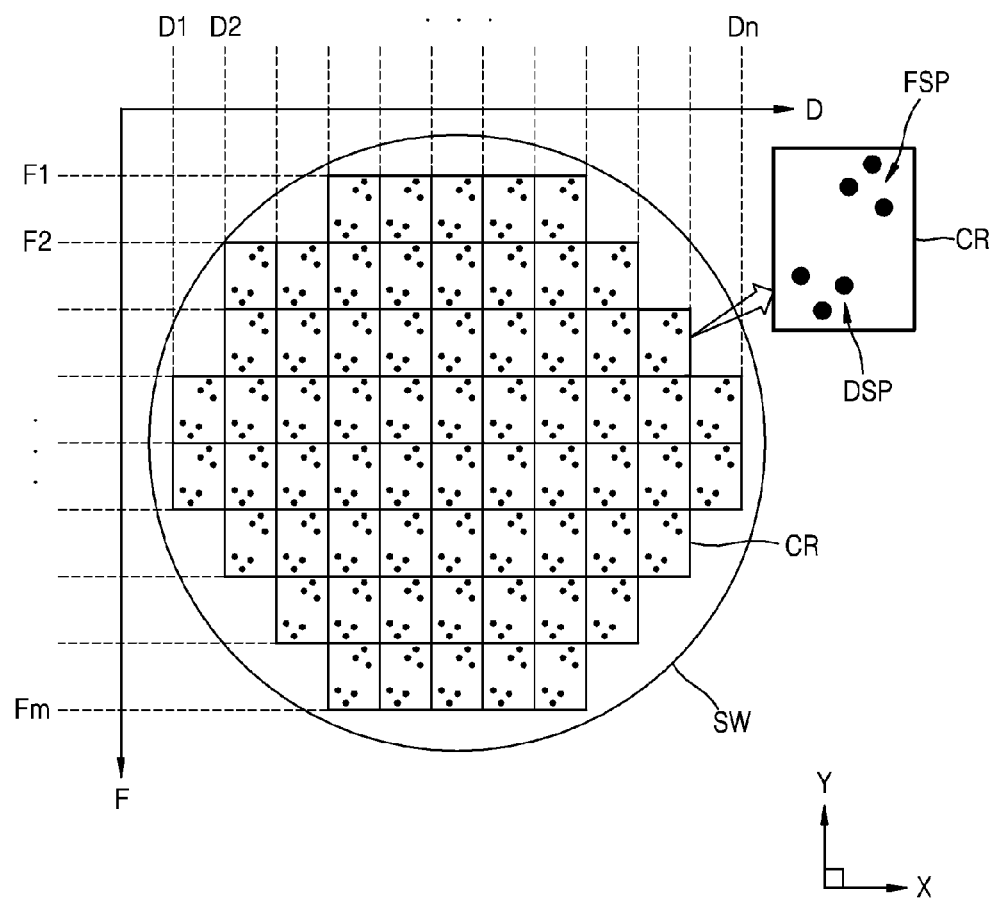
FIG. 5B is a diagram illustrating a split substrate after a plurality of focus split patterns and a plurality of dose split patterns are formed in a plurality of chip regions in lithography metrology methods according to exemplary embodiments of the inventive concept.

FIG. 5B illustrates the split substrate SW after the plurality of focus split patterns FSP and the plurality of dose split patterns DSP are formed in the plurality of chip regions CR in operation P150.

Figure 6:
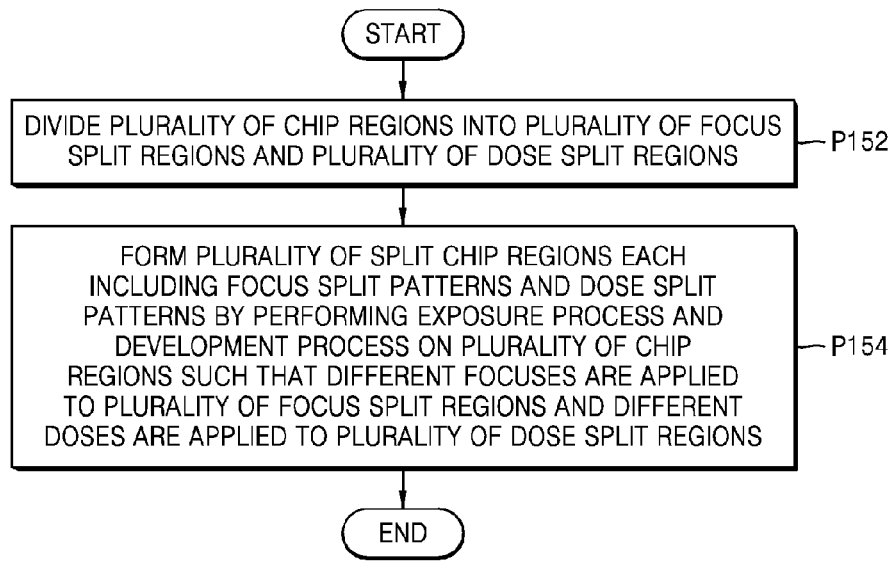
FIG. 6 is a flowchart of a process of forming a plurality of focus split patterns and a plurality of dose split patterns in a plurality of chip regions in lithography metrology methods according to exemplary embodiments of the inventive concept.

FIG. 6 is a flowchart describing a process of forming the plurality of focus split patterns FSP and the plurality of dose split patterns DSP in the plurality of chip regions CR in operation P150.

Referring to FIGS. 5A and 6, in operation P152, the plurality of chip regions CR on the split substrate SW are defined by dividing the split substrate SW into a plurality of focus split regions between parallel lines F1, F2, . . . , Fm and a plurality of dose split regions between parallel lines D1, D2, . . . , Dn. That is, each focus split region is the region between two adjacent lines F1, F2, . . . , Fm such that, for example, a first focus split region is the region delimited by and between lines F1 and F2. Likewise, each dose split region is the region between two adjacent lines D1, D2, . . . , Dn. For ease of description, though, the focus split regions will be referred to as focus split regions F1, F2, . . . , Fm, respectively, and the dose split regions will be referred to as dose split regions D1, D2, . . . , Dn, respectively.

The focus split regions F1, F2, . . . , Fm may each include a respective row of the chip regions CR, each row extending in the direction of the X axis in FIG. 5A.

The dose split regions D1, D2, . . . , Dn may each include a respective column of the chip regions CR, each column extending in the direction of the Y axis in FIG. 5A.

Referring to FIGS. 5B and 6, in operation P154, the chip regions CR are subjected to an exposure process and a development process. In this operation P154, the exposure process is performed on the focus split regions F1, F2, . . . , Fm, with different depths of focus, respectively, and on the dose split regions D1, D2, . . . , Dn, at different doses, respectively. As a result, the focus split patterns FSP and the dose split patterns DSP may be formed in the plurality of chip regions CR.

In some exemplary embodiments, in the plurality of chip regions CR of the spit substrate SW shown in FIGS. 5A and 5B, the depth of focus of the exposure process may be varied in the direction of arrow F (the Y-axis direction) such that the defocus gradually increases from focus split region to focus split region F1, F2, . . . , Fm. In addition, in the plurality of chip regions CR, the dose of the exposure process may be varied in the direction of arrow D (the X-axis direction) such that the exposure dose gradually increases from dose split region to dose split region D1, D2, . . . , Dn. However, the inventive concept is not limited to this example, i.e., the defocus and exposure dose may be varied across the chip regions CR in other ways.

The focus split patterns FSP may have a shape corresponding to the at least one focus pattern determined in operation P120 of FIG. 1. The dose split patterns DSP may have a shape corresponding to the at least one dose pattern determined in operation P130 of FIG. 1.

In operation P160 of FIG. 1, the best focus and the best dose are determined from the plurality of focus split patterns FSP and the plurality of dose split patterns DSP, which are formed in the plurality of chip regions CR in operation P150 as illustrated in FIG. 5B.

Figure 7:
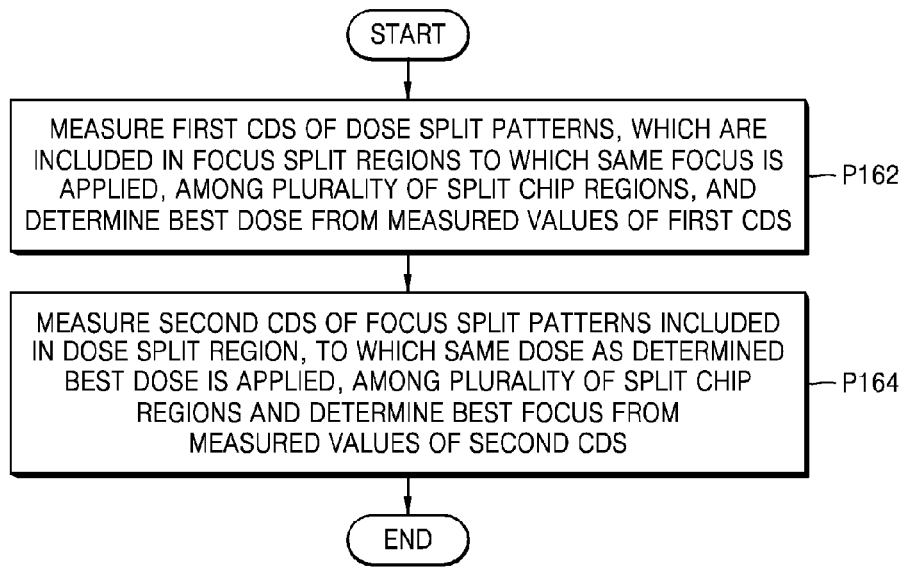
FIG. 7 is a flowchart of a process of determining the best focus and the best dose in lithography metrology methods according to exemplary embodiments of the inventive concept.

FIG. 7 is a flowchart of a process of determining the best focus and the best dose in operation P160 of FIG. 1.

Referring to FIG. 7, in operation P162, first CDs of the dose split patterns DSP, which are formed in the chip regions CR of any one of the focus split regions F1, F2, . . . , Fm (i.e., chip regions at which the exposure process is carried out to at the same depth of focus), are measured, and the best dose is determined from the measured values of the first CDs. That is, the best dose is determined as that dose which was used to expose the chip region CR, within the focus split region, containing the dose split pattern DSP having the best first CD (i.e., the CD closest to the desired or target CD).

Figure 8:
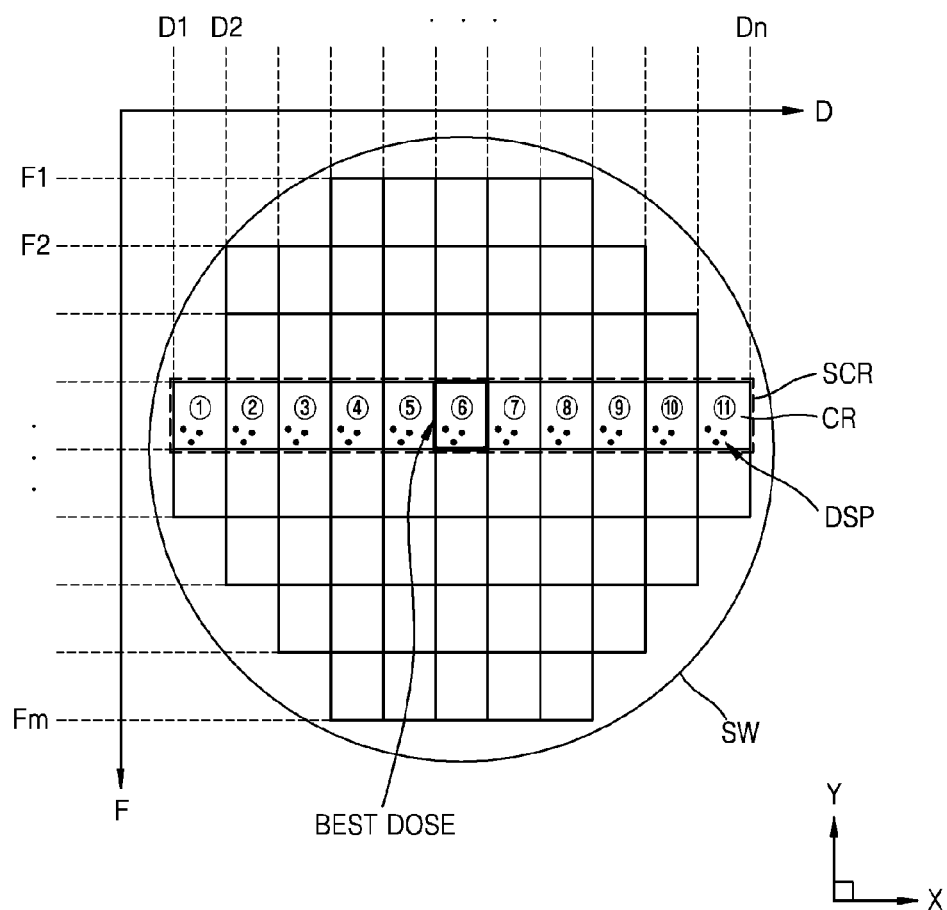
FIG. 8 is a diagram illustrating dose split patterns existing in a split chip region included in any one of focus split regions, to which the same focus is applied, among dose split patterns included in a split substrate formed in lithography metrology methods according to exemplary embodiments of the inventive concept.

FIG. 8 illustrates an example of operation P162. In FIG. 8, the focus split region selected is designated as the split chip region SCR. The CDs of the dose split patterns DSP of the chip regions CR present in the split chip region SCR are measured. The chip regions CR in the split chip region SCR are indicated by ① to ⑪. The dose split patterns DSP may be photoresist patterns formed by exposing and developing a film of the photoresist (or simply "resist") formed on the split substrate SW. In some exemplary embodiments, the measuring of the first CDs of these photoresist patterns may comprise acquiring focus-exposure matrix (FEM) CD data of the dose split patterns DSP on the split substrate SW. The best dose may be determined from the measured values of the first CDs, based on the FEM CD data.

Generally, the FEM CD value may change with changes in the depth of focus as well as changes in the dose. Therefore, in order for the best dose to be determined while minimizing the influence of the depth of focus, a dose pattern(s) showing a relatively high sensitivity to the dose is used. That is, the at least one dose pattern selected in operation P130 of FIG. 1 is a pattern showing a relatively high sensitivity to the dose and is selected from among patterns showing a low sensitivity to the focus. Therefore, the change in the depth of focus may change the CD value only very slightly. On the other hand, the change in the dose may have a very great influence the CD value. Therefore, by selecting the plurality of dose split patterns DSP formed on the split substrate SW as per operation P130 of FIG. 1, it is possible to exclude the influence of the focus in determining the best dose, i.e., the dose that will provide substantially the same CD as the target CD.

Again, this is shown in the example of FIG. 8. Even when the depth of focus used to produce the dose split patterns in the chip regions CR in the split chip region SCR is not the optimal depth of focus, the plurality of dose split patterns DSP in the split chip region SCR have a very low sensitivity to depth of focus. Therefore, the dose split patterns in the chip regions CR in the split chip region SCR may be effectively used to find the best dose.

In operation P162 of FIG. 7, a plot of the relationship of the measured values of the first CDs with respect to the changes in the dose may be used to determine the best dose from the measured values of the first CDs.

Figure 9:
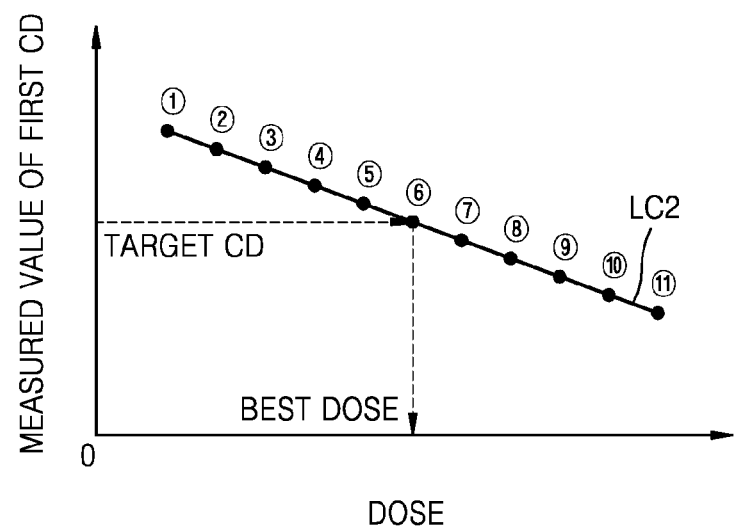
FIG. 9 is a linear curve illustrating a relationship of a dose change of a first CD measured from a plurality of dose split patterns included in a plurality of chip regions in FIG. 8.

FIG. 9 illustrates a linear plot LC2 of such a relationship between dose and measured first CDs of dose split patterns DSP in the chip regions CR ① to ⑪ in FIG. 8. In this example, the best dose is determined as the dose used to form the dose split pattern DSP in the chip region CR ⑥ because the first CD of the dose split pattern DSP in the chip region CR ⑥ best matches the target CD.

In a case in which several dose split patterns DSP are formed in each chip region CR, the linear curve LC1 of FIG. 9 is constructed from the measured first CDs of all of the dose split patterns DSP. Then several of the "best dose values" are acquired from the linear curve LC1, i.e., several of the data points having a y intercept corresponding and/or close to the target CD are acquired. Then, the best dose values of these data points are averaged, and the average is determined as the best dose used to form the dose split patterns DSP on the split substrate SW.

In operation P164 of FIG. 7, CDs of the focus split patterns (referred to hereinafter as "second CDs") in that dose split region D1, D2, . . . , or Dn containing the chip region CR that was determined as having the dose split pattern DSP formed by the best dose, are measured. The best depth of focus is determined from the measured values of the second CDs.

Figure 10:
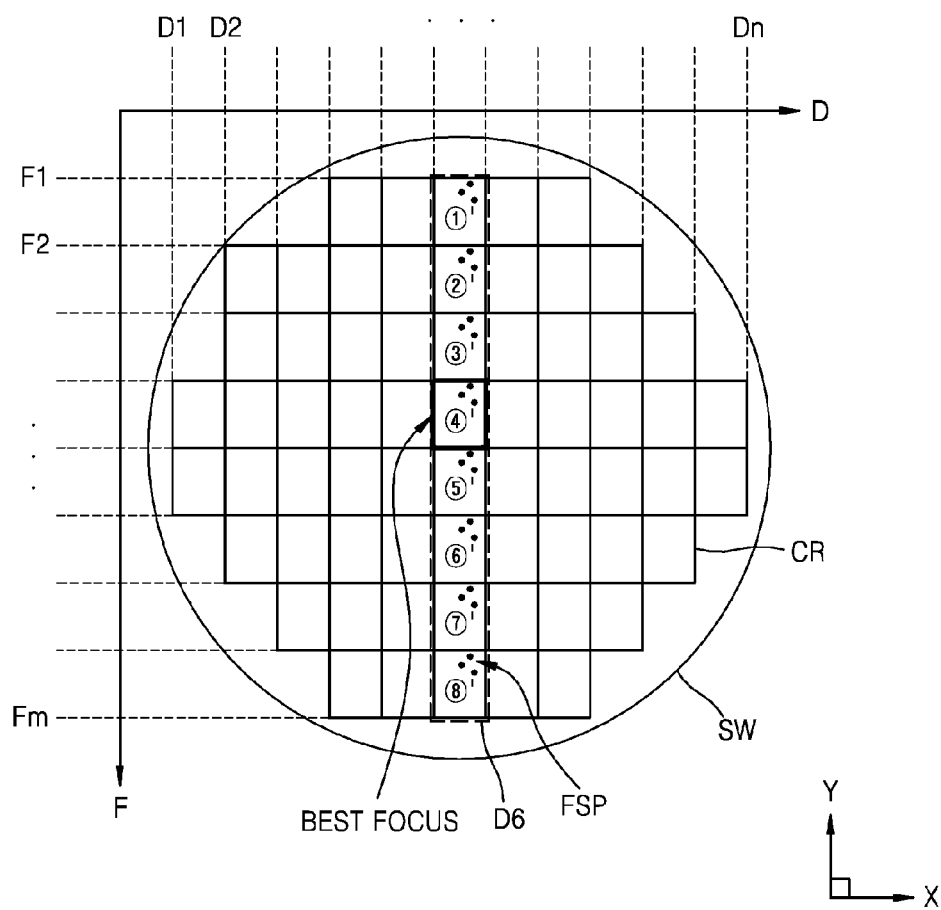
FIG. 10 is a diagram of focus split patterns existing in a split chip region, to which the best dose is applied, so as to determine the best focus in lithography metrology methods according to exemplary embodiments of the inventive concept.

An example of this operation P164 is illustrated in FIG. 10. FIG. 10 illustrates the focus split patterns FSP formed in the plurality of chip regions CR in a split chip region D6 on the split substrate SW. In FIG. 10, the other focus split patterns FSP are not illustrated for the sake of clarity.

To determine the best depth of focus, the second CDs of the focus split patterns FSP in the chip regions CR (designated ①' to ⑧') in the split chip region (that intersects the row containing chip region ⑥ in FIGS. 8 and 9 may be measured. These are the chip regions ①' to ⑧' in the column designated D6 in FIG. 10. Alternatively, the second CDs of the focus split patterns FSP in the chip regions CR in a split chip region closest to chip region ⑥ may be measured in a case in which the dose split patterns and focus split patterns are not formed in the same chip regions. The column D6 including or closest to the chip region ⑥ is used because the chip region ⑥ was determined to have the dose split pattern DSP formed by the best dose.

In operation P164 of FIG. 7, a Bossung curve showing a relationship between the measured values of the second CDs and depth of focus may be used to determine the best focus from the measured values of the second CDs.

Figure 11:
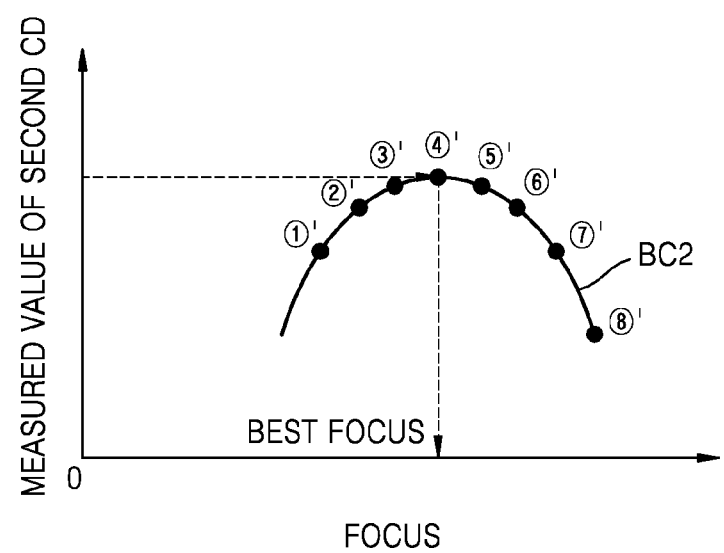
FIG. 11 is a Bossung curve illustrating a relationship between focus/defocus and measured values of second CDs measured from a plurality of focus split patterns included in a plurality of chip regions in FIG. 10.

FIG. 11 illustrates an example of such a Bossung curve BC2 plotted using the values of the second CDs of the focus split patterns FSP in chip regions CR indicated by ①' to ⑧', respectively.

The depth of focus at the inflection point in the Bossung curve BC2 of FIG. 11 may be determined as the best depth of focus.

In this example as illustrated in FIGS. 10 and 11, the focus split pattern FSP formed in the chip region CR indicated by ④' is the pattern deemed to have been formed by the best focus condition.

In a case in which each chip region CR in FIG. 10 includes several of the focus split patterns, the Bossung curve BC2 of FIG. 11 is constructed from measurements of the second CDs of all of the focus split patterns FSP. Then, a plurality of the best focus values of data points at and near the inflection point are acquired from the Bossung curve BC2, these best focus values are averaged, and the average is determined as the best focus condition used to form the focus split patterns FSP on the split substrate SW.

Figure 12:
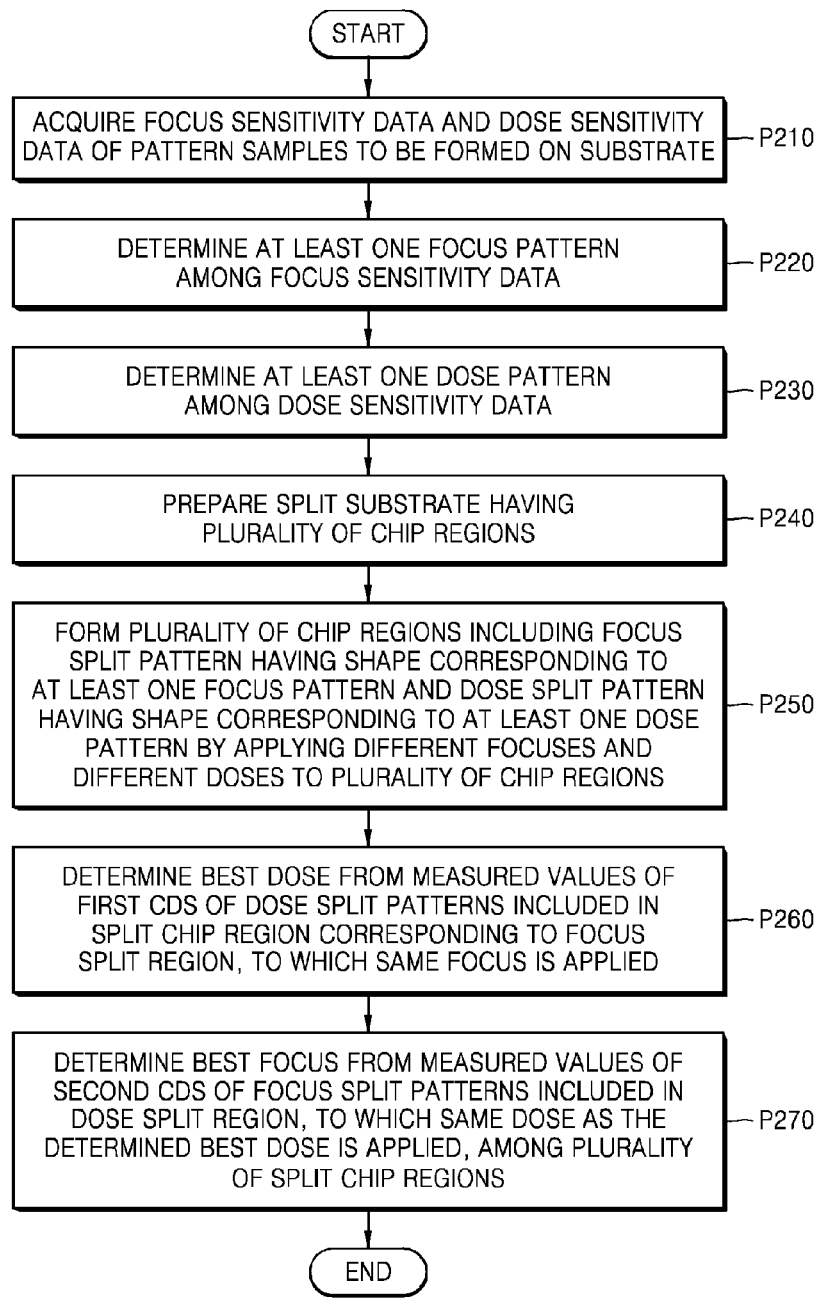
FIG. 12 is a flowchart of a lithography metrology method according to another exemplary embodiment of the inventive concept.

FIG. 12 is a flowchart of a lithography metrology method according to another exemplary embodiment of the inventive concept.

Referring to FIG. 12, in operation P210, focus sensitivity data and dose sensitivity data are acquired with respect to sample patterns to be formed on a substrate.

The method of acquiring the focus sensitivity data and the dose sensitivity data is substantially the same as the method described above with reference to operation P110 of FIG. 1 and FIGS. 2 to 4.

In operation P220 of FIG. 12, at least one focus pattern selected in descending order of the focus sensitivity from among the focus sensitivity data of the sample patterns acquired in operation P210 is determined.

The number of the focus patterns selected may be determined according to the actual exposure condition in a lithography process.

In operation P230 of FIG. 12, at least one low-sensitivity focus pattern in ascending order of the focus sensitivity from among the dose sensitivity data of the sample patterns is determined, and at least one dose pattern selected in descending order of the dose sensitivity from among the at least one low-sensitivity focus pattern is determined.

In some exemplary embodiment, the at least one low-sensitivity focus pattern may be selected from among patterns of which the focus sensitivity calculated using Equation 1 above is equal to or lower than about 1%.

The number of the dose patterns may be determined according to the actual exposure condition in a lithography process.

Because the at least one focus pattern determined in operation P220 has a relatively high focus sensitivity and the at least one dose pattern determined in operation P230 has a relatively high dose sensitivity, the values of the CDs of the at least one focus pattern and the at least one dose pattern may change greatly with changes in the depth of focus and the dose of an exposure process, respectively. Therefore, these patterns may be effectively used to accurately find the best depth of focus and the best dose of an exposure process of a lithography method of forming a photoresist pattern on a substrate.

In operation P240 of FIG. 12, a split substrate having a plurality of chip regions is prepared.

The process of preparing the split substrate is substantially the same as the process described above with reference to operation P140 of FIG. 1 and FIG. 5A. That is, in operation P250 of FIG. 12, the split substrate is divided into a plurality of chip regions having focus split regions and dose split regions. Also, the processes of the flowchart of FIG. 6 may be performed. As a result, as illustrated in FIG. 5B, focus split patterns FSP and dose split patterns DSP are formed in the chip regions CR. The focus split patterns FSP correspond to the at least one focus pattern selected in operation P220, and the dose split patterns correspond to the at least one dose pattern selected in operation P230.

In operation P260 of FIG. 12, the best dose is determined from the measured values of the first CDs of the dose split patterns FSP in one of the split chip regions across which the same depth of focus was used. A process similar to operation P162 of FIG. 7 may be performed as described above with reference to FIGS. 8 and 9 to determine the best dose from the values of the first CDs.

In operation P270 of FIG. 12, the best focus is determined from the measured values of the second CDs of the focus split patterns in the split chip region to which across which the same dose was applied. A process similar to operation P164 of FIG. 7 may be performed as described above with reference to FIGS. 10 and 11 to determine the best depth focus from the values of the second CDs.

In some exemplary embodiments, when the at least one focus pattern is determined in operation P220 of FIG. 12, a plurality of focus patterns may be determined. In addition, when the at least one dose pattern is determined in operation P230 of FIG. 12, a plurality of dose patterns may be determined. In this case, when the plurality of split chip regions are formed in operation P250, the plurality of split chip regions may be formed to include a plurality of focus split patterns having a shape corresponding to the plurality of focus patterns and a plurality of dose split patterns having a shape corresponding to the plurality of dose patterns. When the best dose is determined in operation P260 of FIG. 12, after the first CDs of the plurality of dose split patterns are measured, the best dose values corresponding to the target CD among the measured values of the first CDs of the plurality of dose split patterns may be determined, and an average of the best dose values of the plurality of dose split patterns may be set as the best dose. In some exemplary embodiments, similar to the case of determining the best dose, when the best focus is determined in operation P270 of FIG. 12, the best focus values corresponding to the maximum CD among the measured values of the second CDs of the plurality of focus split patterns may be determined, and an average of the best focus values of the plurality of focus split patterns may be set as the best focus.

In the related art, the best focus and the best dose serving as an important factor during the lithography process for forming the patterns on the substrate have been found depending on an operator's experience, with proposing definite criteria or methods. However, in the lithography metrology method according to the exemplary embodiments described above with reference to FIGS. 1 to 12, the concepts of focus sensitivity and dose sensitivity are introduced. The focus sensitivity and the dose sensitivity are digitized, and patterns suitable for finding the best focus and the best dose are extracted. The exposure process is performed on the extracted patterns based on various depth of focus values and various dose values, and then, CD data of patterns obtained by the development process are acquired. Then, the best focus and the best dose to be finally applied in forming desired patterns are determined from the CD data. Therefore, it is possible to determine the best focus and the best dose depending on accurate data, without merely relying on an operator's subjective determination. In addition, the use of the best focus and the best dose determined in the above manner makes it possible to monitor the focus and the dose that have been applied to the patterns formed on the substrate.

In the lithography metrology method according to the exemplary embodiments described above, when determining the focus patterns and the dose patterns based on the focus sensitivity data and the dose sensitivity data, it is possible to randomly select and determine the focus patterns and the dose patterns from among various patterns, without being limited to particular patterns. Therefore, it is possible to determine suitable focus patterns and suitable dose patterns by reflecting unique characteristics of elements necessary for integrated circuit devices, for example, nodes or layers.

The lithography metrology methods according to the exemplary embodiments have been described above with reference to FIGS. 1 to 12, but the inventive concept is not limited to the above-described particular examples and various modifications and changes may also be made without departing from the scope of the inventive concept.

Figure 13A:
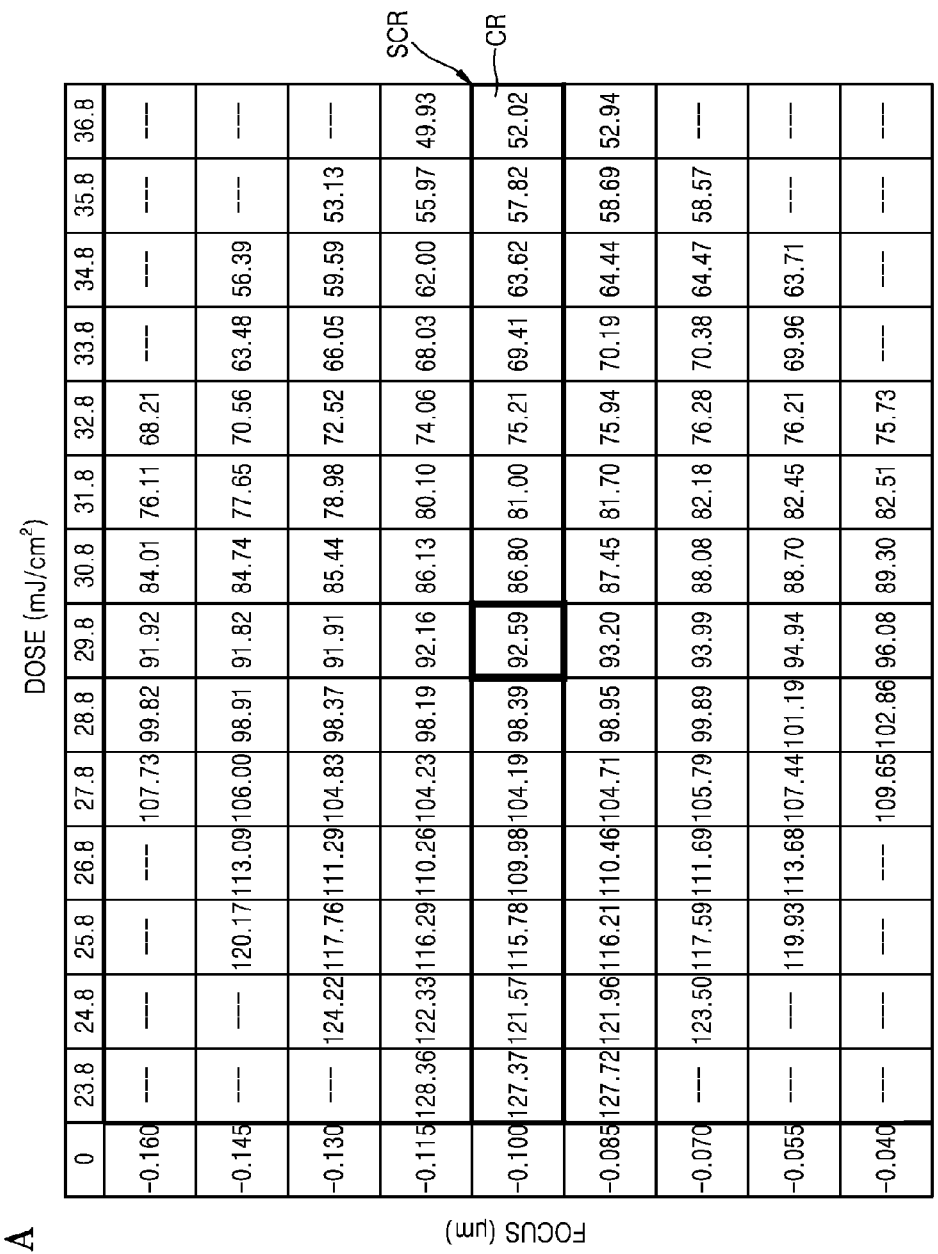
FIGS. 13A to 14B are diagrams of data acquired in lithography metrology methods according to exemplary embodiments of the inventive concept.

FIG. 13A illustrates values of CDs of dose split patterns in the form of contact hole patterns in the chip regions, in a case in which the target CD of the contact hole patterns is 92 nm. In FIG. 13A, the unit of value of the CDs is nm. These dose split contact hole patterns may be formed by a lithography method, described with reference to FIG. 5B, including an exposure process in which the depth of focus and dose are varied across the chip regions CR. The CD of the dose split contact hole patterns formed in the plurality of chip regions CR as a result of the lithography method are measured.

Similar to FIG. 8, FIG. 13A also highlights a split chip region SCR including the chip region CR whose contact hole pattern has a CD close to the target CD (within ±1% of the target CD). In this example, the split chip region SCR is that across which the same depth of focus of −0.100 μm was applied.

Figure 13B:
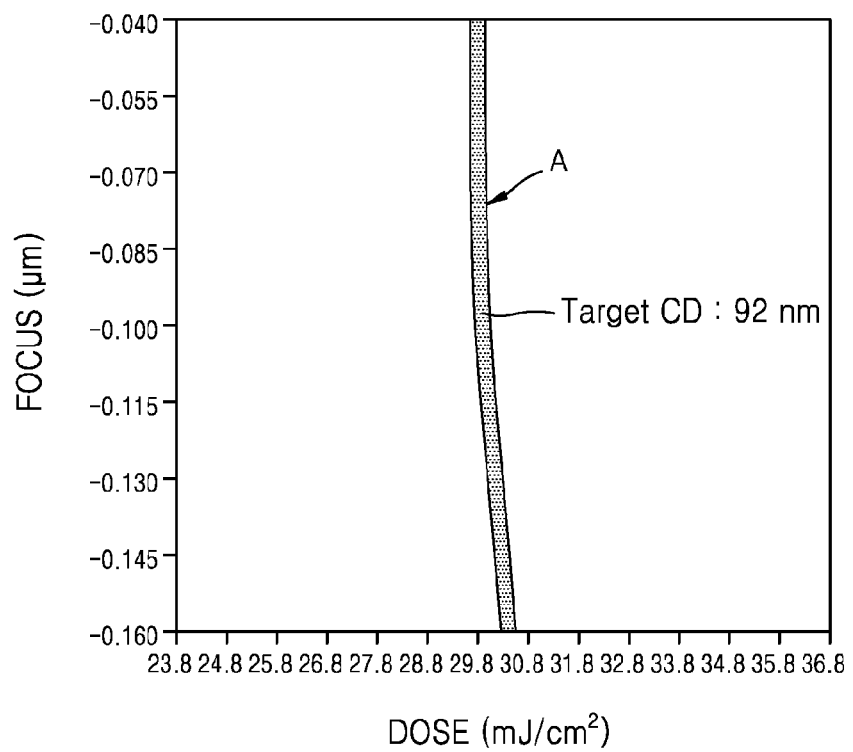

FIG. 13B is a graph illustrating a curve A obtained in association with a dose value applied to a chip region CR, from which a CD value close to a target CD of 92 nm (within a measurement error of ±1%) is obtained, at various focuses applied to the plurality of chip regions CR, based on the result of FIG. 13A.

From the results of FIGS. 13A and 13B, in the split chip region SCR selected, the dose value of about 29.8 mJ/cm$^2$ in the chip region CR having a CD value of 92.59 nm, i.e., a value within ±1% of the target CD, may be determined as the best dose.

Figure 14A:
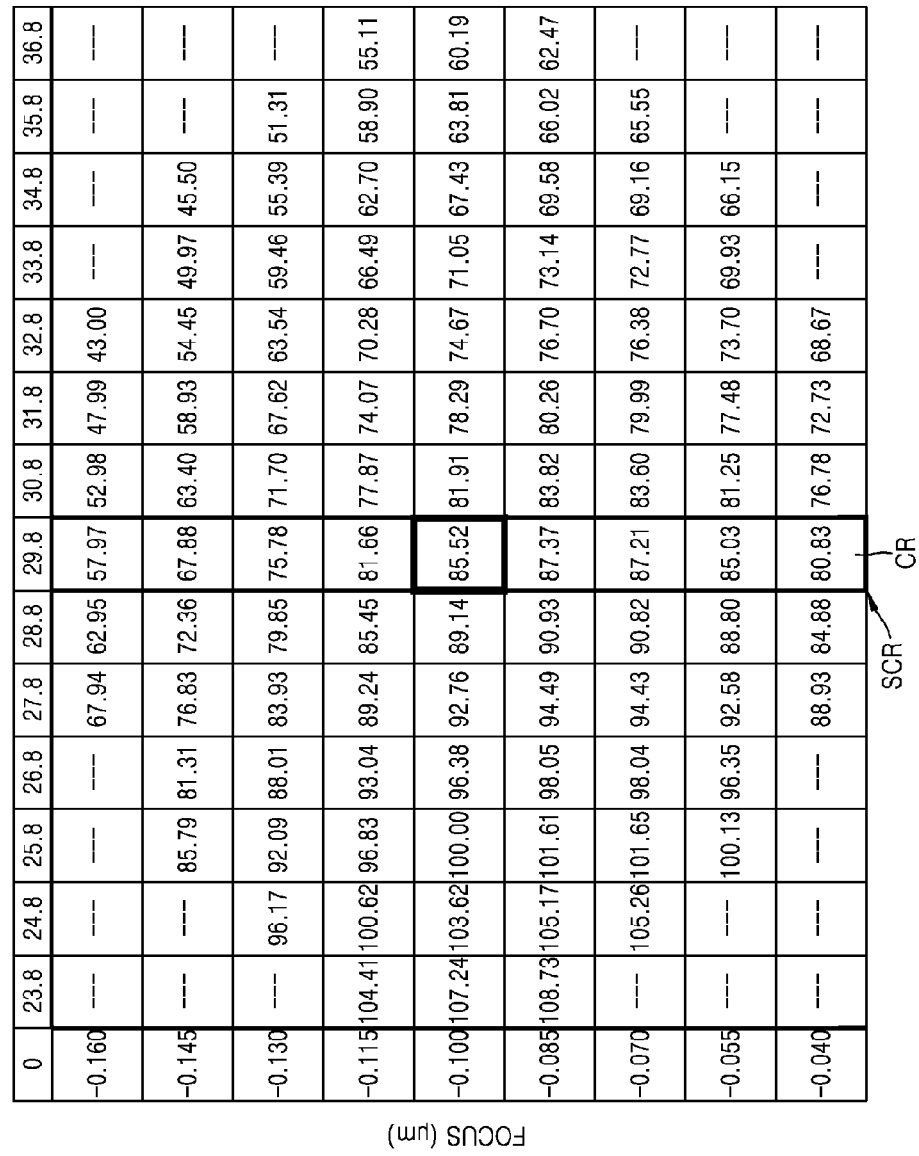

FIG. 14A illustrates CD values of focus split patterns in the form of contact hole patterns formed in the chip regions, in the case in which the target CD of these focus split contact hole patterns is 86 nm. In FIG. 14A, the units of the values of the CDs are nm. These focus split contact hole patterns may also formed by the process described with reference to FIG. 5B.

FIG. 14A, like FIG. 10, highlights a split chip region SCR across which the same dose of 29.8 mJ/cm$^2$ is applied.

Figure 14B:
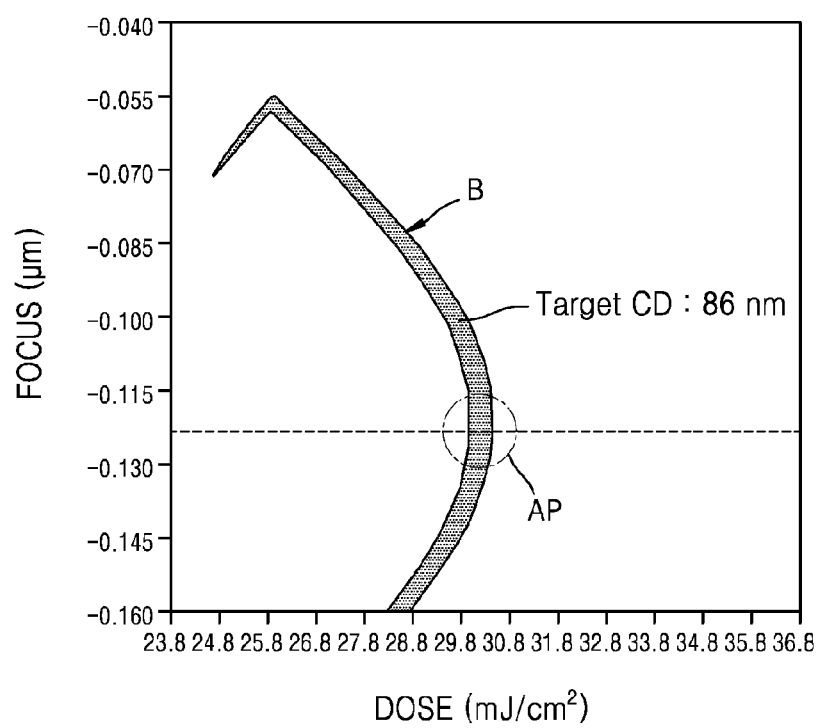

FIG. 14B is a graph illustrating a curve B obtained in association with a dose value applied to a chip region CR, from which a CD value close to a target CD of 86 nm (within a measurement error of ±1%) is obtained, at various focuses applied to the plurality of chip regions CR, based on the result of FIG. 14A.

From the results of FIGS. 14A and 14B, a depth of focus at a position corresponding to an apex AP of the curve B in FIG. 14B may be determined as the best focus.

Figure 15:
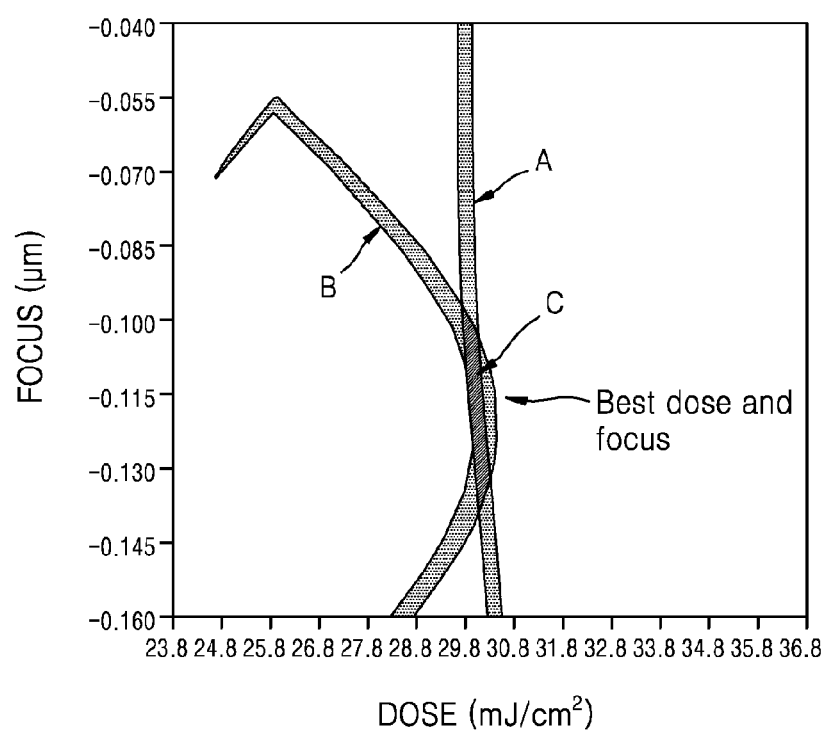
FIG. 15 is a graph illustrating a process of determining the best focus and the best dose in lithography metrology methods according to exemplary embodiments of the inventive concept.

FIG. 15 is a graph combining the results of FIGS. 13B and 14B to illustrate an example of a process of determining the best focus and the best dose.

As illustrated in FIG. 15, any set of values of the depth of focus and the dose of region C where the curve A obtained in FIG. 13B and the curve B obtained in FIG. 14B overlap may be used as the best dose and the best depth of focus.

Figure 16:
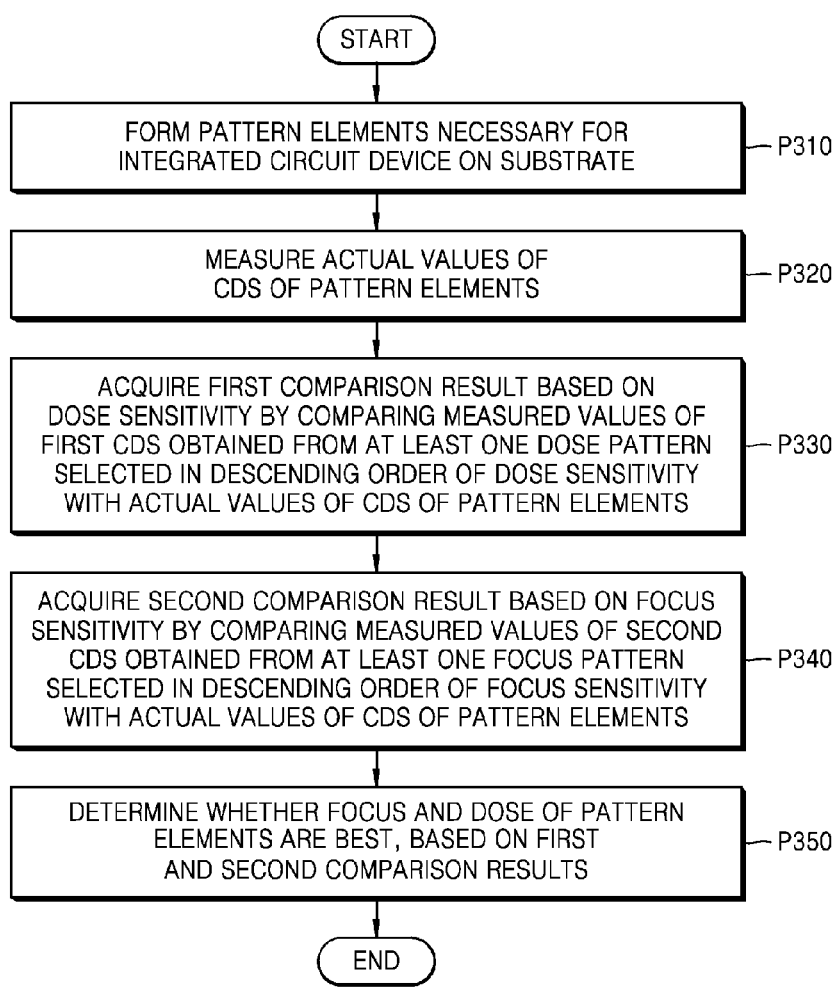
FIG. 16 is a flowchart of a lithography monitoring method according to an exemplary embodiment of the inventive concept.

FIG. 16 is a flowchart of a lithography monitoring method according to an exemplary embodiment of the inventive concept.

Referring to FIG. 16, in operation P310, pattern elements necessary for an integrated circuit device are formed on a substrate.

The substrate may be a semiconductor wafer or a glass mask.

In order to form the pattern elements necessary for the integrated circuit device on the substrate, a feature layer may be formed on the substrate and a photoresist film may be formed on the feature layer. An exposure process and a development process may be performed on the photoresist film to form a plurality of photoresist patterns on the substrate. The plurality of photoresist patterns may define or correspond to the pattern elements necessary for the integrated circuit device.

The feature layer may be a conductive layer or an insulating layer. For example, the feature layer may include a metal, a semiconductor, or an insulating material. In some exemplary embodiments, the feature layer may be a part of the substrate.

The photoresist film may include a resist for extreme ultraviolet (EUV) (13.5 nm), a resist for $F_2$ excimer laser (157 nm), a resist for ArF excimer laser (193 nm), or a resist for KrF excimer laser (248 nm). The photoresist film may include a positive photoresist or a negative photoresist.

Figure 17:
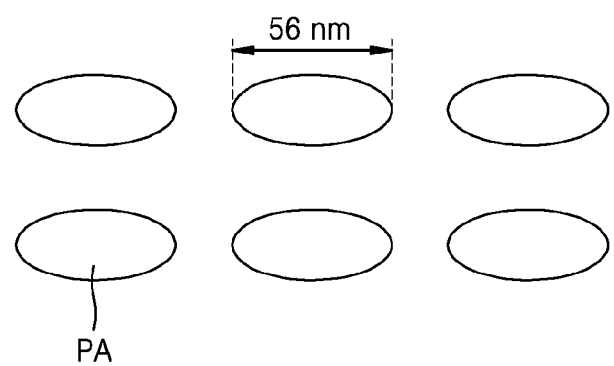
FIG. 17 is a plan view illustrating a plurality of pattern elements formed on a substrate in lithography monitoring methods according to exemplary embodiments of the inventive concept.

FIG. 17 is a plan view of the plurality of pattern elements PA formed on the substrate.

The plurality of pattern elements PA may be a plurality of hole patterns.

In operation P320 of FIG. 16, the actual values of the CDs of the pattern elements PA are determined through measuring the pattern elements.

In the plurality of pattern elements PA illustrated in FIG. 17, a target CD may be 50 nm and a measured value of a CD of any one of the plurality of pattern elements PA actually formed on the substrate may be 56 nm.

Figure 18:
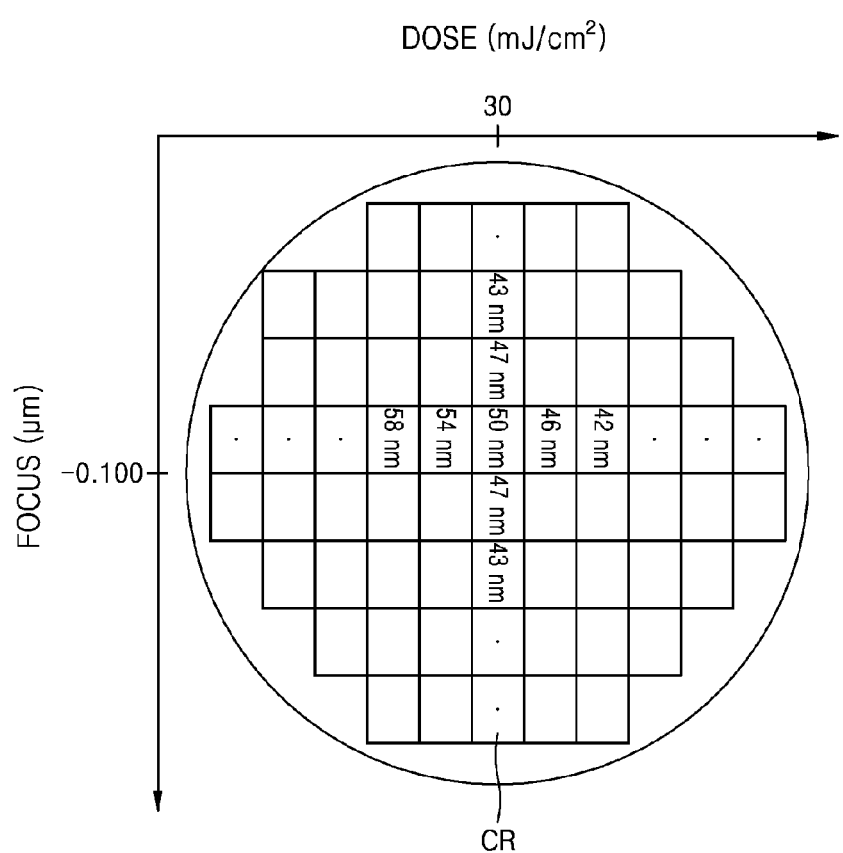
FIG. 18 is a graph of measured values of CDs of pattern elements randomly selected from among a plurality of pattern elements obtained by applying various focuses and various doses to a plurality of chip regions formed on a substrate in lithography monitoring methods according to exemplary embodiments of the inventive concept.

FIG. 18 is a graph of measured values of CDs of pattern elements randomly selected from among the plurality of pattern elements PA obtained by applying various focuses and various doses to the plurality of chip regions CR formed on the substrate.

In operation P330 of FIG. 16, a first comparison result based on dose sensitivity is acquired by comparing the measured values of the first CDs obtained from at least one dose pattern selected in descending order of the dose sensitivity with the actual values of the CDs of the pattern elements according to the lithography metrology methods described above with reference to FIGS. 1 to 15.

In operation P340 of FIG. 16, a second comparison result based on focus sensitivity is acquired by comparing the measured values of the second CDs obtained from at least one focus pattern selected in descending order of the focus sensitivity with the actual values of the CDs of the pattern elements according to the lithography metrology methods described above with reference to FIGS. 1 to 15.

Figure 19:
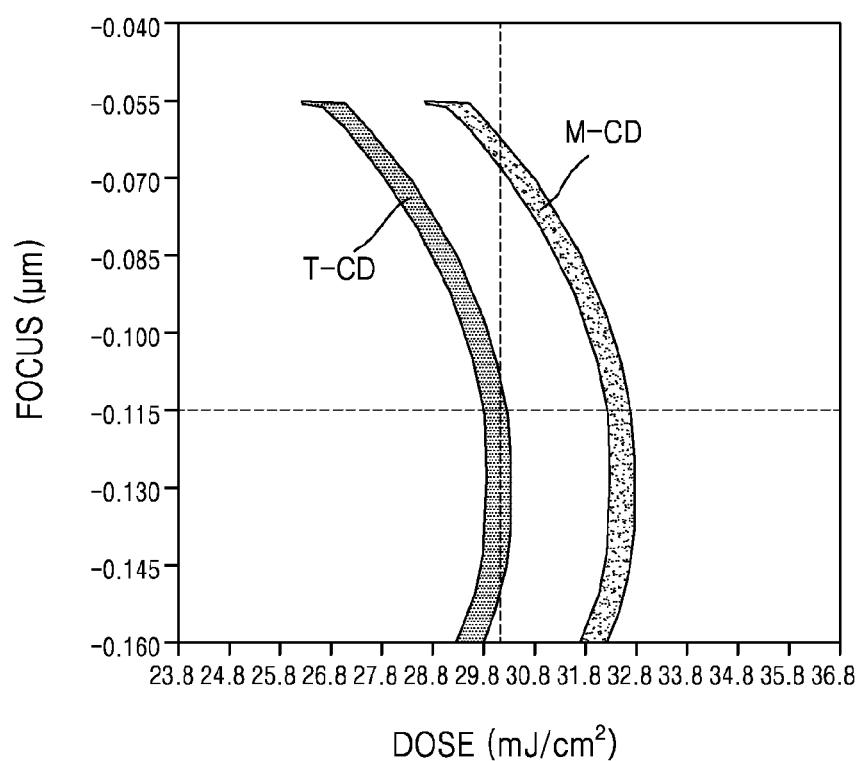
FIG. 19 is a graph of a comparison between a target curve and a measured curve in lithography monitoring methods according to exemplary embodiments of the inventive concept.

FIG. 19 is a graph of a comparison between a target curve T-CD for the measured values of the second CDs obtained from at least one focus pattern selected in descending order of the focus sensitivity in operation P340 of FIG. 16 and a measurement curve M-CD for the actual measured values of the CDs of the pattern elements.

The target curve T-CD may be obtained by the method described above with reference to FIGS. 13A and 13B. The measurement curve M-CD may be obtained from the CD measurement data as illustrated in FIG. 18.

In operation P350 of FIG. 16, it is determined whether the focus and the dose of the pattern elements are best, based on the first and second comparison results.

In the example of FIG. 19, the focuses corresponding to the apexes of the target curve T-CD and the measurement curve M-CD are about −0.115 μm, and it may be determined that the best focus was applied to the pattern elements used to obtain the measurement curve M-CD.

In the lithography monitoring methods according to the exemplary embodiments, the presence or absence of defocus and/or dedose may be determined by combining the first comparison result and the second comparison result. Dedose refers to a dose that is outside an allowable range from the best dose.

Figure 20A:
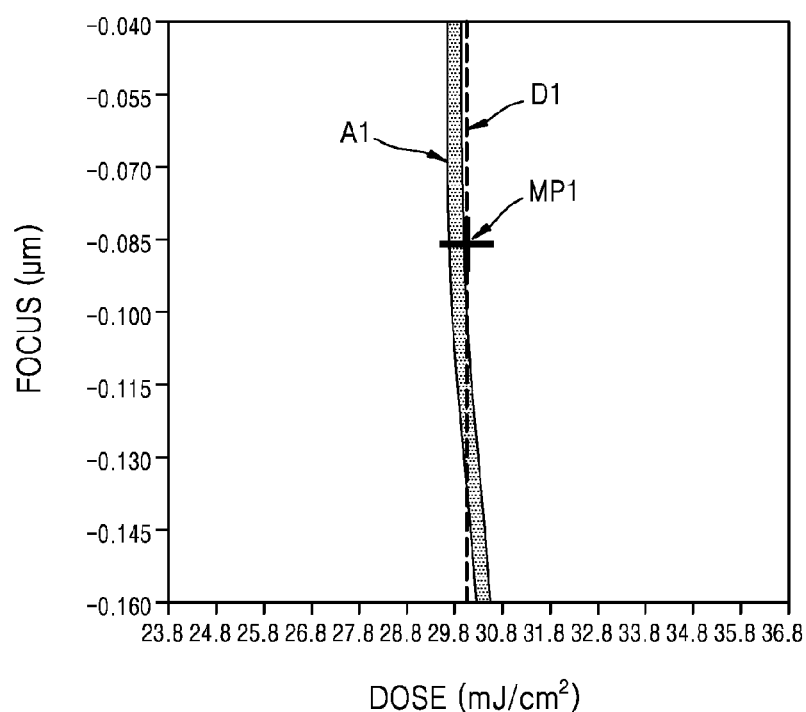
FIGS. 20A and 20B are graphs of a first comparison result and a second comparison result in lithography monitoring methods according to exemplary embodiments of the inventive concept.
Figure 20B:
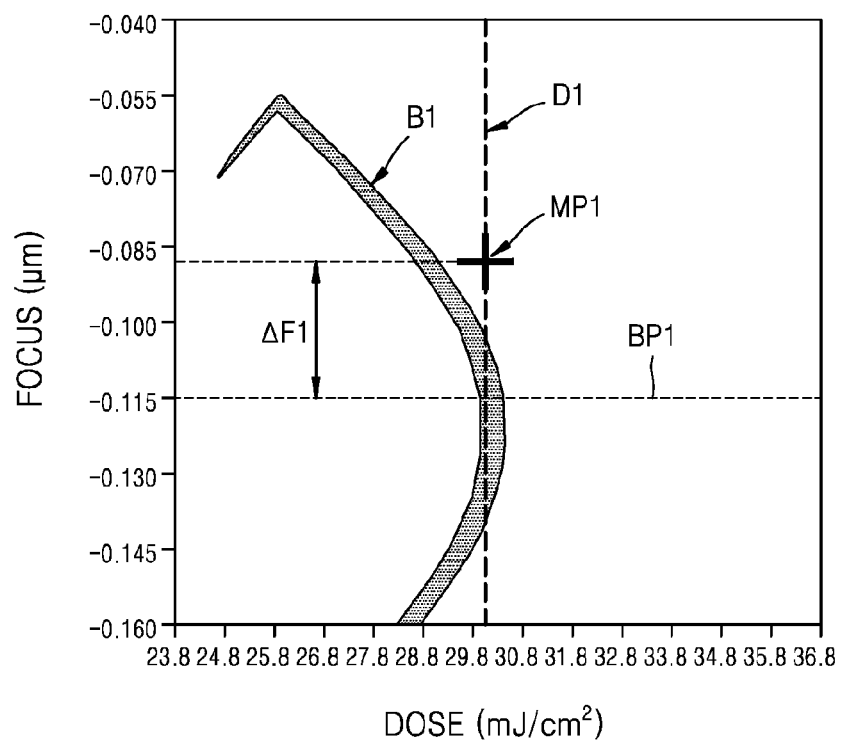

FIGS. 20A and 20B are graphs of an example of the first comparison result and the second comparison result in operation P350 of FIG. 16, respectively.

Specifically, FIG. 20A is a graph of the result of comparison between a target curve A1 and a curve D1 in operation P330 of FIG. 16, wherein the target curve A1 is obtained based on the measured values of the first CDs obtained from the dose patterns selected in descending order of the dose sensitivity in a similar manner to that described above with reference to FIGS. 13A and 13B, and the curve D1 is obtained based on the actual values of the CDs of the pattern elements in a similar manner to that described above with reference to FIGS. 13A and 13B.

It may be determined from FIG. 20A that the measured values of the CDs of the pattern elements indicated by the curve D1 are substantially equal to or similar to the target CD value indicated by the target curve A1.

FIG. 20B is a graph of the result of comparison between a best focus position BP1 in a target curve B1 and a focus position MP1 in operation P340 of FIG. 16, wherein the best focus position BP1 in the target curve A1 is obtained based on the measured values of the section CDs obtained from the focus patterns selected in descending order of the focus sensitivity in a similar manner to that described above with reference to FIGS. 14A and 14B, and the focus position MP1 is determined based on the actual values of the CDs of the pattern elements in a similar manner to that described above with reference to FIGS. 14A and 14B.

In FIG. 20B, there is a difference of ΔF1 between the focus position MP1 and the best focus position BP1 of the pattern elements. It may be determined from such results that there is an actual difference between the measured values of the CDs of the pattern elements and the target CD value indicated by the target curve B1.

Whether the focus and the dose of the pattern elements are best is determined from the results of FIGS. 20A and 20B in operation P350 of FIG. 16, it may be determined from the result of FIG. 20A that the actual values of the CDs of the pattern elements are within the allowable range based on the measured values of the first CDs obtained from the at least one dose pattern selected in descending order of the dose sensitivity. It may be determined from the result of FIG. 20B that the actual values of the CDs of the pattern elements are outside the allowable range based on the measured values of the second CDs obtained from the at least one focus pattern selected in descending order of the focus sensitivity. In this case, it may be determined that the defocus, which is outside the allowable focus, was applied during the lithography process for forming the pattern elements.

Figure 21A:
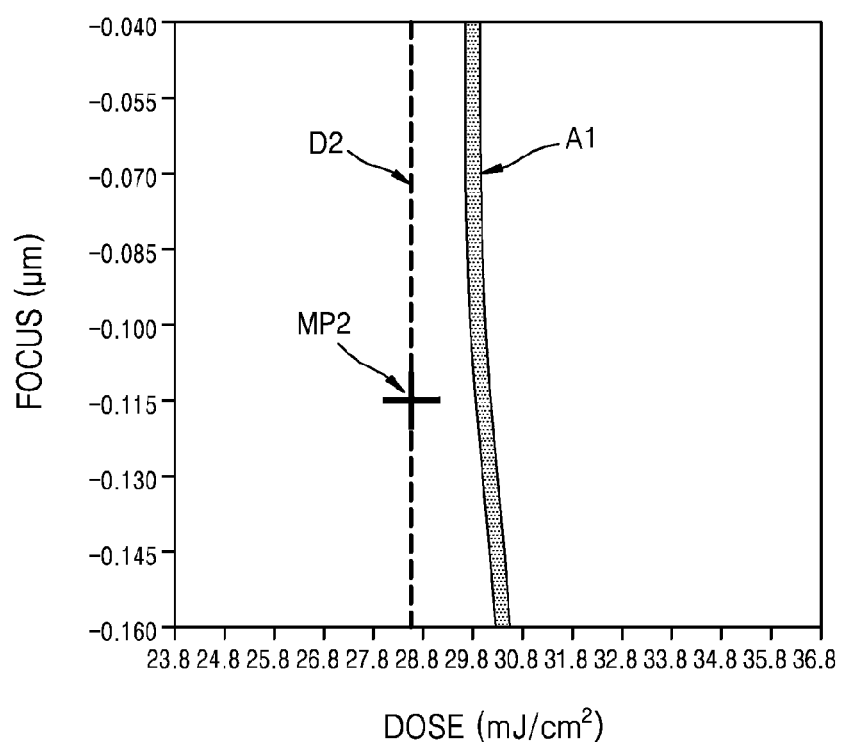
FIGS. 21A and 21B are graphs of a first comparison result and a second comparison result in lithography monitoring methods according to exemplary embodiments of the inventive concept.
Figure 21B:
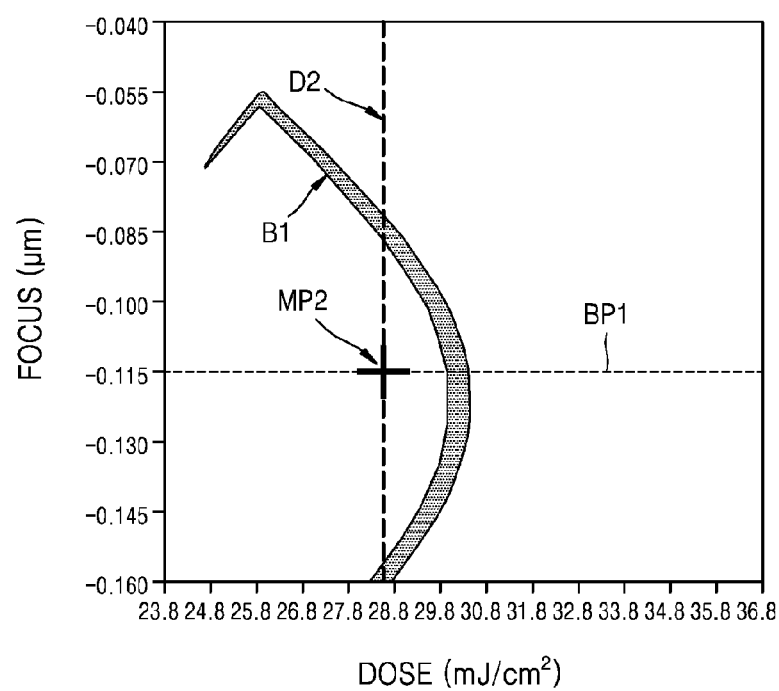

FIGS. 21A and 21B are graphs of another example of the first comparison result and the second comparison result in operation P350 of FIG. 16, respectively.

Specifically, FIG. 21A is a graph of the result of comparison between a target curve A1 and a curve D2 in operation P330 of FIG. 16, wherein the target curve A1 is obtained based on the measured values of the first CDs obtained from the dose patterns selected in descending order of the dose sensitivity in a similar manner to that described above with reference to FIGS. 13A and 13B, and the curve D2 is obtained based on the actual values of the CDs of the pattern elements in a similar manner to that described above with reference to FIGS. 13A and 13B.

It may be determined from FIG. 21A that the measured values of the CDs of the pattern elements indicated by the curve D2 are substantially different from the target CD value indicated by the target curve A1.

FIG. 21B is a graph of the result of comparison between a best focus position BP1 in a target curve B1 and a focus position MP2 in operation P340 of FIG. 16, wherein the best focus position BP1 in the target curve A1 is obtained based on the measured values of the section CDs obtained from the focus patterns selected in descending order of the focus sensitivity in a similar manner to that described above with reference to FIGS. 14A and 14B, and the focus position MP2 is determined based on the actual values of the CDs of the pattern elements in a similar manner to that described above with reference to FIGS. 14A and 14B.

In FIG. 21B, the focus position MP2 and the best focus position BP1 of the pattern elements are substantially equal to or similar to each other. It may be determined from such results that there is no actual difference between the measured values of the CDs of the pattern elements and the target CD value indicated by the target curve B1.

Whether the focus and the dose of the pattern elements are best is determined from the results of FIGS. 21A and 21B in operation P350 of FIG. 16, it may be determined from the result of FIG. 21A that the actual values of the CDs of the pattern elements are outside the allowable range based on the measured values of the first CDs obtained from the at least one dose pattern selected in descending order of the dose sensitivity. It may be determined from the result of FIG. 21B that the actual values of the CDs of the pattern elements are within the allowable range based on the measured values of the second CDs obtained from the at least one focus pattern selected in descending order of the focus sensitivity. In this case, it may be determined that the dedose, which is outside the allowable dose, was applied during the lithography process for forming the pattern elements.

Figure 22A:
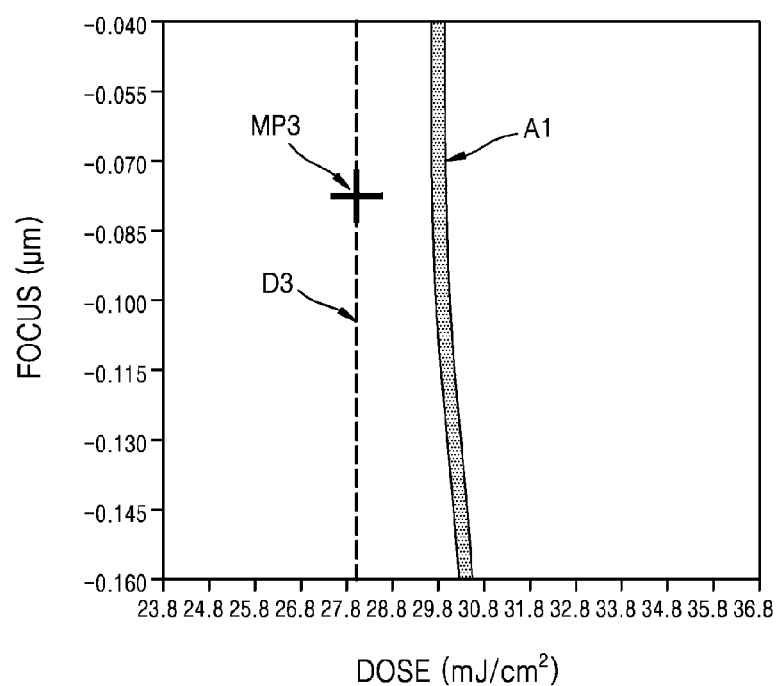
FIGS. 22A and 22B are graphs of a first comparison result and a second comparison result in lithography monitoring methods according to exemplary embodiments of the inventive concept.
Figure 22B:
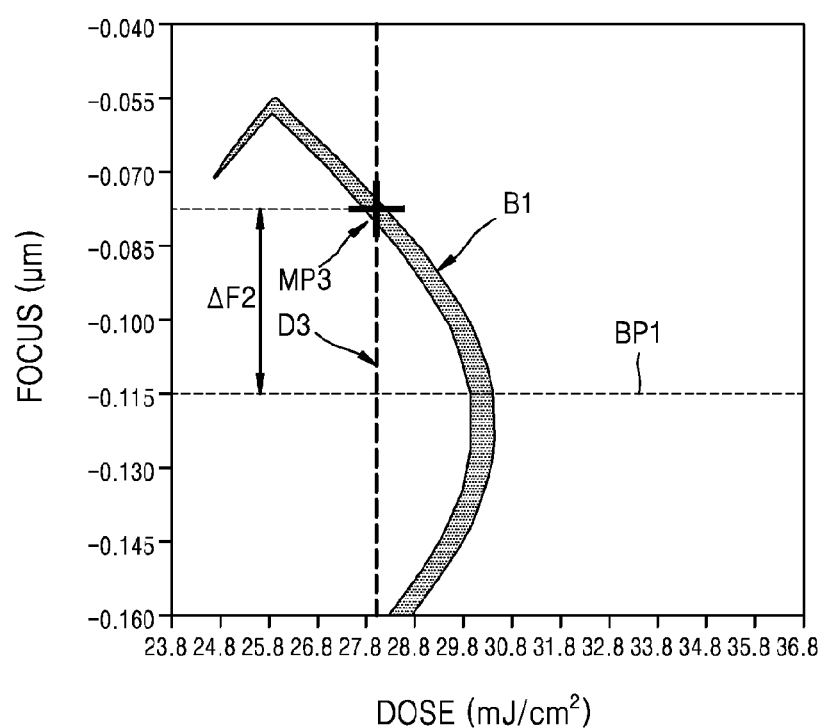

FIGS. 22A and 22B are graphs of another example of the first comparison result and the second comparison result in operation P350 of FIG. 16, respectively.

Specifically, FIG. 22A is a graph of the result of comparison between a target curve A1 and a curve D3 in operation P330 of FIG. 16, wherein the target curve A1 is obtained based on the measured values of the first CDs obtained from the dose patterns selected in descending order of the dose sensitivity in a similar manner to that described above with reference to FIGS. 13A and 13B, and the curve D3 is obtained based on the actual values of the CDs of the pattern elements in a similar manner to that described above with reference to FIGS. 13A and 13B.

It may be determined from FIG. 22A that the measured values of the CDs of the pattern elements indicated by the curve D3 are substantially different from the target CD value indicated by the target curve A1.

FIG. 22B is a graph of the result of comparison between a best focus position BP1 in a target curve B1 and a focus position MP3 in operation P340 of FIG. 16, wherein the best focus position BP1 in the target curve A1 is obtained based on the measured values of the section CDs obtained from the focus patterns selected in descending order of the focus sensitivity in a similar manner to that described above with reference to FIGS. 14A and 14B, and the focus position MP3 is determined based on the actual values of the CDs of the pattern elements in a similar manner to that described above with reference to FIGS. 14A and 14B.

In FIG. 22B, there is a difference of $\Delta F2$ between the focus position MP3 and the best focus position BP1 of the pattern elements. It may be determined from such results that there is an actual difference between the measured values of the CDs of the pattern elements and the target CD value indicated by the target curve B1.

Whether the focus and the dose of the pattern elements are best is determined from the results of FIGS. 22A and 22B in operation P350 of FIG. 16, it may be determined from the result of FIG. 22A that the actual values of the CDs of the pattern elements are outside the allowable range based on the measured values of the first CDs obtained from the at least one dose pattern selected in descending order of the dose sensitivity. It may be determined from the result of FIG. 22B that the actual values of the CDs of the pattern elements are outside the allowable range based on the measured values of the second CDs obtained from the at least one focus pattern selected in descending order of the focus sensitivity. In this case, it may be determined that the dedose that is outside the allowable dose and the defocus that is outside the allowable focus were applied during the lithography process for forming the pattern elements.

As described above, in the lithography metrology method according to the exemplary embodiments, the patterns sensitive to the dose and the patterns sensitive to the focus are extracted through a simulation by using Equations 1 and 2, and the best focus and the best dose are determined based on accurate data from the extracted patterns. By using the best focus and the best dose, it is possible to accurately monitor the focus and the dose, which are applied during the lithography process on the patterns formed on the substrate, and the fine change in the focus. Therefore, it is possible to improve the accuracy and reliability of the lithography process monitoring.

Figure 23:
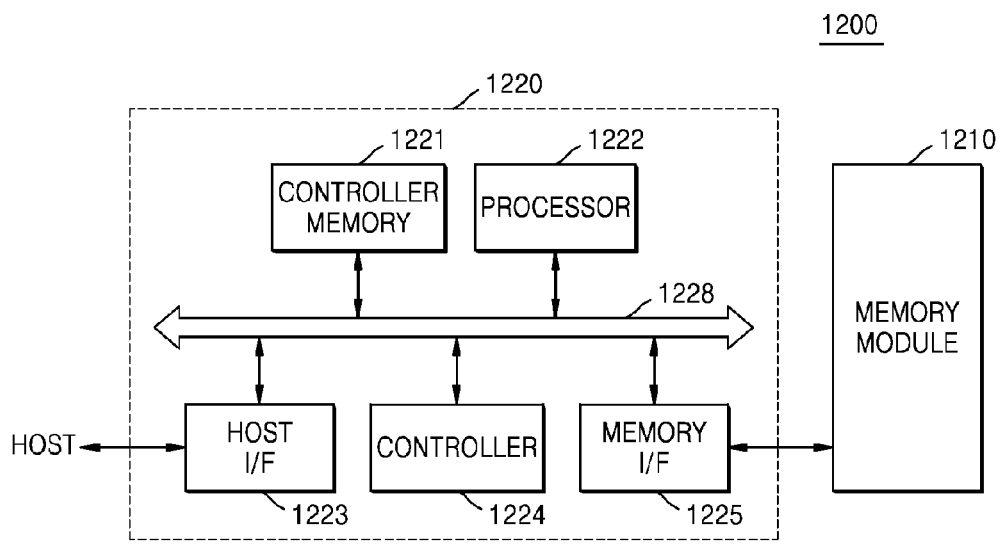
FIG. 23 is a block diagram of a memory card including an integrated circuit device manufactured through a lithography metrology method according to an exemplary embodiment of the inventive concept, or an integrated circuit device manufactured through a lithography monitoring method according to an exemplary embodiment of the inventive concept.

FIG. 23 is a block diagram of a memory card 1200 including an integrated circuit device manufactured through a lithography metrology method according to an exemplary embodiment of the inventive concept, or an integrated circuit device manufactured through a lithography monitoring method according to an exemplary embodiment of the inventive concept.

The memory card 1200 includes a memory controller 1220 that generates a command/address signal, and a memory module 1210, for example, a flash memory including one or more flash memory elements. The memory controller 1220 includes a host interface 1223 that transmits the command/address signal to a host or receives the command/address signal from the host, and a memory interface 1225 that transmits the command/address signal to the memory module 1210 or receives the command/address signal from the memory module 1210. The host interface 1223, the controller 1224, and the memory interface 1225 communicate with a controller memory 1221 such as a static random access memory (SRAM) and a processor 1222 such as a central processing unit (CPU) through a common bus 1228.

The memory module 1210 receives the command/address signal from the memory controller 1220. In response to the command/address signal, the memory module 1210 stores data in at least one memory element on the memory module 1210 and searches data from the at least one memory element. Each of the memory elements includes a plurality of addressable memory cells, and a decoder that receives the command/address signal and generates a row signal and a column signal so as to access at least one among the addressable memory cells during program and read operations.

At least one among the components of the memory card 1200 including the memory controller 1220, the electronic devices 1221, 1222, 1223, 1224, and 1225 included in the memory controller 1220, and the memory module 1210 includes the integrated circuit device manufactured through the lithography metrology method according to the exemplary embodiment of the inventive concept, or the integrated circuit device manufactured through the lithography monitoring method according to the exemplary embodiment of the inventive concept.

Figure 24:
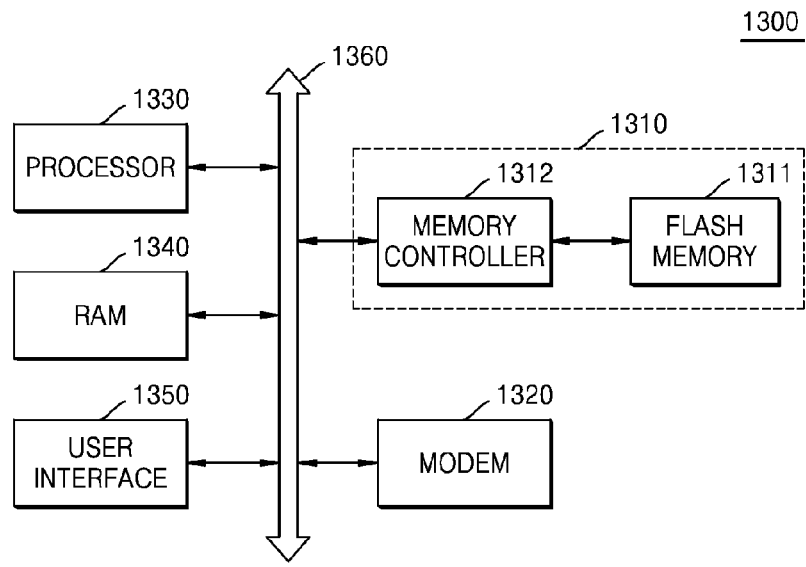
FIG. 24 is a block diagram of a memory system employing a memory card including an integrated circuit device manufactured through a lithography metrology method according to an exemplary embodiment of the inventive concept, or an integrated circuit device manufactured through a lithography monitoring method according to an exemplary embodiment of the inventive concept.

FIG. 24 is a block diagram of a memory system 1300 employing a memory card 1310 including the integrated circuit device manufactured through the lithography metrology method according to the exemplary embodiment of the inventive concept, or the integrated circuit device manufactured through the lithography monitoring method according to the exemplary embodiment of the inventive concept.

Referring to FIG. 24, the memory system 1300 may include a processor 1330 such as a CPU, a random access memory (RAM) 1340, a user interface 1350, and a modem 1320, all of which communicate with one another through a common bus 1360. The respective elements transmit signals to the memory card 1310 through the common bus 1360 and receive signals from the memory card 1310. At least one among the respective elements of the memory system 1300 including the memory card 1310, the processor 1330, the RAM 1340, the user interface 1350, and the modem 1320 includes the integrated circuit device manufactured through the lithography metrology method according to the exemplary embodiment of the inventive concept, or the integrated circuit device manufactured through the lithography monitoring method according to the exemplary embodiment of the inventive concept.

The memory system 1300 may be applied to various electronic application fields. For example, the memory system 1300 may be applied to a solid state drive (SSD), a complementary metal-oxide semiconductor (CMOS) image sensor (CIS), and computer application chipset fields.

The memory systems and the devices disclosed herein may be any one selected from a ball grid array (BGA), a chip scale package (CSP), a plastic leaded chip carrier (PLCC), a plastic dual in-line package (PDIP), a multi-chip package (MCP), a wafer-level fabricated package (WFP), a wafer-level processed stock package (WSP), and the like, but are not limited to these examples.

While the inventive concept has been particularly shown and described with reference to exemplary embodiments thereof, it will be understood that various changes in form and details may be made therein without departing from the spirit and scope of the following claims.

What is claimed is:

1. A lithography metrology method comprising:
   acquiring focus sensitivity data and dose sensitivity data of sample patterns to be formed on a substrate;
   determining at least one focus pattern selected in descending order of focus sensitivity from among the acquired focus sensitivity data of the pattern samples;
   selecting at least one low-sensitivity focus pattern in ascending order of the focus sensitivity from among the acquired dose sensitivity data of the pattern samples, and determining at least one dose pattern selected in descending order of dose sensitivity from among the at least one low-sensitivity focus pattern;
   preparing a split substrate having a plurality of chip regions;
   forming a plurality of focus split patterns and forming a plurality of dose split patterns in the plurality of chip regions, wherein each of the focus split patterns has a shape corresponding to that of the at least one focus pattern and each of the dose split patterns has a shape corresponding to that of the at least one dose pattern; and
   determining a best focus and a best dose from the plurality of focus split patterns and the plurality of dose split patterns.

2. The lithography metrology method of claim 1, wherein the acquiring of the focus sensitivity data and the dose sensitivity data comprises:
   acquiring simulation critical dimension (CD) data of the sample patterns from an aerial image of the sample patterns produced by performing an optical model simulation of a lithography exposure process in which depth of focus and dose of the exposure process are varied;
   acquiring the focus sensitivity data of the sample patterns based on the simulation CD data; and
   acquiring the dose sensitivity data of the sample patterns based on the simulation CD data.

3. The lithography metrology method of claim 2, wherein the acquiring of the focus sensitivity data comprises:
   plotting a Bossung curve showing a relationship of the simulation CD data with respect to defocus, based on the simulation CD data; and
   determining the focus sensitivity data from the Bossung curve, and
   the acquiring of the dose sensitivity data comprises:
   plotting a linear curve showing a relationship of the simulation CD data with respect to the dose change, based on the simulation CD data; and
   determining the dose sensitivity data from the linear curve.

4. The lithography metrology method of claim 3, wherein the focus sensitivity data is determined based on the following equation:

$$\text{Focus sensitivity (\%)} = \{|CD_0 - CD_x|/CD_0\} \times 100$$

where $CD_0$ is a value of the simulation CD data when the defocus is 0 in the bossung curve,
$CD_x$ is a value of the simulation CD data when the defocus is defocused by x from 0 in the bossung curve, and
x is a constant greater than 0.

5. The lithography metrology method of claim 3, wherein the dose sensitivity data is determined based on the following equation:

$$\text{Dose sensitivity (\%)} = \{|CD_{d1} - CD_2|/CD_0\} \times 100$$

where $CD_{d1}$ is a CD data value when the dose is smaller by d1 than a reference dose at which the dose is normalized in the linear curve, $CD_{d2}$ is a CD data value when the dose is larger by d2 than the reference dose at which the dose is normalized in the linear curve, and d1 and d2 are constants greater than 0.

6. The lithography metrology method of claim 1, wherein the forming of the plurality of focus split patterns and the plurality of dose split patterns in the plurality of chip regions comprise:

dividing the plurality of chip regions into a plurality of focus split regions and a plurality of dose split regions; and performing an exposure process and a development process on the plurality of chip regions such that different focuses are applied to the plurality of focus split regions and different doses are applied to the plurality of dose split regions, thereby forming a plurality of split chip regions, each of the split chip regions including a focus split pattern having a shape corresponding to the at least one focus pattern and a dose split pattern having a shape corresponding to the at least one dose pattern, on the split substrate.

7. The lithography metrology method of claim 6, wherein the determining of the best focus and the best dose from the plurality of focus split patterns and the plurality of dose split patterns comprises:

measuring first CDs of the dose split patterns included in a split chip region corresponding to a focus split region, to which a same focus is applied, among the plurality of split chip regions, and determining the best dose from the measured values of the first CDs; and measuring second CDs of the focus split patterns included in a dose split region, to which a same dose as the determined best dose is applied, among the plurality of split chip regions, and determining the best focus from the measured values of the second CDs.

8. The lithography metrology method of claim 7, wherein the determining of the best dose comprises:

plotting a linear curve showing a relationship of the measured values of the first CDs with respect to the dose change, based on the measured values of the first CDs; and determining a dose corresponding to a target CD as the best dose from the linear curve.

9. The lithography metrology method of claim 7, wherein the determining of the best focus comprises:

plotting a Bossung curve showing a relationship of the measured values of the second CDs with respect to defocus, based on the measured values of the second CDs; and setting a focus corresponding to a CD at an inflection point of the Bossung curve as the best focus.

10. A lithography metrology method comprising:

acquiring focus sensitivity data and dose sensitivity data with respect to sample patterns to be formed on a substrate;

determining at least one focus pattern selected in descending order of focus sensitivity from among the acquired focus sensitivity data of the sample patterns;

selecting at least one low-sensitivity focus pattern in ascending order of the focus sensitivity from among the acquired dose sensitivity data of the sample patterns, and determining at least one dose pattern selected in descending order of dose sensitivity from among the at least one low-sensitivity focus pattern;

preparing a split substrate having a plurality of chip regions;

dividing the plurality of chip regions into a plurality of focus split regions and a plurality of dose split regions, and performing an exposure process and a development process on the plurality of chip regions such that different focuses are applied to the plurality of focus split regions and different doses are applied to the plurality of dose split regions, thereby forming a plurality of split chip regions, each of the split chip regions including a focus split pattern having a shape corresponding to the at least one focus pattern and a dose split pattern having a shape corresponding to the at least one dose pattern, on the split substrate;

measuring first CDs of the dose split patterns included in a split chip region corresponding to a focus split region, to which a same focus is applied, among the plurality of split chip regions, and determining a best dose from the measured values of the first CDs; and measuring second CDs of the focus split patterns included in a dose split region, to which a same dose as the determined best dose is applied, among the plurality of split chip regions, and determining a best focus from the measured values of the second CDs.

11. The lithography metrology method of claim 10, wherein the focus sensitivity data and the dose sensitivity data are acquired from simulation CD data of an aerial image of the sample patterns, which is obtained by performing an optical model simulation of an exposure process in which depth of focus and dose are varied.

12. The lithography metrology method of claim 11, wherein the acquiring of the focus sensitivity data and the dose sensitivity data comprises:

plotting a Bossung curve showing a relationship of the simulation CD data with respect to defocus so as to acquire the focus sensitivity data; and determining the focus sensitivity data from the bossung curve, based on the following equation:

Focus sensitivity (%)=$\{|CD_0-CD_x|/CD_0\} \times 100$ where $CD_0$ is a value of the simulation CD data when the defocus is 0 in the bossung curve, $CD_x$ is a value of the simulation CD data when the defocus is defocused by x from 0 in the bossung curve, and x is a constant greater than 0.

13. The lithography metrology method of claim 11, wherein the acquiring of the focus sensitivity data and the dose sensitivity data comprises:

plotting a linear curve showing a relationship of the simulation CD data with respect to the dose change so as to acquire the dose sensitivity data; and determining the dose sensitivity data from the linear curve, based on the following equation:

Dose sensitivity (%)=$\{|CD_{d1}-CD_{d2}|/CD_0\} \times 100$ where $CD_{d1}$ is a CD data value when the dose is smaller by d1 than a reference dose at which the dose is normalized in the linear curve, $CD_{d2}$ is a CD data value when the dose is larger by d2 than the reference dose at which the dose is normalized in the linear curve, and d1 and d2 are constants greater than 0.

14. The lithography metrology method of claim 10, wherein in the determining of the at least one focus pattern, a plurality of focus patterns are determined, in the determining of the at least one dose pattern, a plurality of dose patterns are determined, in the forming of the plurality of split chip regions, the plurality of split chip regions are formed to include a plurality of focus split patterns having a shape corresponding to the plurality of focus patterns and a plurality of dose split patterns having a shape corresponding to the plurality of dose patterns, and in the determining of the best dose, after the first CDs of the plurality of dose split patterns are measured, the best dose values corresponding to the target CD among the measured values of the first CDs of the plurality of dose split patterns are determined, and an average of the best dose values of the plurality of dose split patterns is set as the best dose.

15. The lithography metrology method of claim 14, wherein the determining of the best focus comprises determining best focus values corresponding to a maximum CD among the measured values of the second CDs of the plurality of focus split patterns, and determining an average of the best focus values of the plurality of focus split patterns as the best focus.

16. A lithography metrology method comprising:
acquiring focus sensitivity data and dose sensitivity data of sample patterns to be formed on a substrate;
using the acquired focus sensitivity data to select at least one of the sample patterns as a focus pattern or patterns, wherein the at least one of the sample patterns selected as the focus pattern or patterns has a critical dimension (CD) that is among the most dependent among the CDs of the sample patterns on depth of focus of an exposure process;
using the acquired focus sensitivity and dose sensitivity data to select at least one of the sample patterns as a dose pattern or patterns, wherein the at least one of the sample patterns selected as the dose pattern or patterns has a CD that is among the most dependent among the CDs of the sample patterns on the dose of the exposure and is among the least dependent among the CDs of the sample patterns on the depth the focus of the exposure process;
preparing a split substrate having a plurality of chip regions;
forming a plurality of focus split patterns and forming a plurality of dose split patterns in the plurality of chip regions, wherein each of the focus split patterns has a shape corresponding to that of the at least one focus pattern and each of the dose split patterns has a shape corresponding to that of the at least one dose pattern; and determining a depth of focus and dose of a lithography method from the plurality of focus split patterns and the plurality of dose split patterns.

17. The lithography metrology method of claim 16, wherein the acquiring of the focus sensitivity data and the dose sensitivity data comprises:
simulating the forming of sample patterns by an exposure process in which depth of focus and dose of the exposure are varied, and
acquiring values of the CDs from the simulation of the exposure process.

18. The lithography metrology method of claim 17, wherein the acquiring of the focus sensitivity data further comprises:
creating a Bossung plot of a relationship of the values of the CDs acquired through the simulation and depth of focus, and
the acquiring of the dose sensitivity data further comprises:
creating a linear plot of a relationship of the values of the CDs acquired through the simulation and dose.

19. The lithography metrology method of claim 18, wherein the focus sensitivity data is acquired based on the following equation:

Focus sensitivity (%)={$|CD_0-CD_x|/CD_0$}×100 where $CD_0$ is a value of the CD in the Bossung plot at depth of defocus equal to 0, and
$CD_x$ is a value of the CD in the Bossung plot at a depth of focus equal to x, wherein x is greater than 0, and
wherein the dose sensitivity data is acquired based on the following equation:

Dose sensitivity (%)={$|CD_{d1}-CD_{d2}|/CD_0$}×100 where $CD_{d1}$ is a value of the CD in the linear plot at dose smaller by d1 than a dose normalized in the linear plot,
$CD_{d2}$ is a value of the CD in the linear plot when at dose larger by d2 than the dose normalized in the linear curve, wherein d1 and d2 are each greater than 0.

20. A method of forming patterns on a substrate comprising the lithography metrology method as claimed in claim 16, and the lithography method carried out at the depth of focus and dose determined from the plurality of focus split patterns and the plurality of dose split patterns in the lithography metrology method.

* * * * *